US009346395B2

United States Patent
Sato et al.

(10) Patent No.: US 9,346,395 B2
(45) Date of Patent: May 24, 2016

(54) LIGHT-EMITTING APPARATUS, ILLUMINATION SYSTEM, VEHICLE HEADLAMP, PROJECTOR, AND METHOD FOR MANUFACTURING LIGHT-EMITTING APPARATUS

(75) Inventors: Rina Sato, Osaka (JP); Katsuhiko Kishimoto, Osaka (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 421 days.

(21) Appl. No.: 14/002,285

(22) PCT Filed: Mar. 8, 2012

(86) PCT No.: PCT/JP2012/055997
§ 371 (c)(1),
(2), (4) Date: Aug. 29, 2013

(87) PCT Pub. No.: WO2012/121343
PCT Pub. Date: Sep. 13, 2012

(65) Prior Publication Data
US 2013/0335989 A1   Dec. 19, 2013

(30) Foreign Application Priority Data

Mar. 8, 2011   (JP) .................. 2011-050635
Jun. 21, 2011  (JP) .................. 2011-137842

(51) Int. Cl.
*F21V 9/16*     (2006.01)
*B60Q 1/04*    (2006.01)
(Continued)

(52) U.S. Cl.
CPC ... *B60Q 1/04* (2013.01); *F21S 8/04* (2013.01); *F21S 48/1145* (2013.01);
(Continued)

(58) Field of Classification Search
CPC ......... F21V 29/2293; F21V 9/00; F21V 9/16; F21V 29/70; F21V 29/20; F21V 7/22; G03B 21/16; G03B 21/204; G03B 21/14; G02B 6/0008; F21S 8/04; F21S 48/1145; F21S 48/1241; B60Q 1/04; H01S 5/005; F21Y 2101/025; B82Y 20/00
See application file for complete search history.

(56) References Cited

U.S. PATENT DOCUMENTS 7,165,871 B2 *  1/2007  Takeda ............... F21S 48/1154
                                                           362/538
8,371,706 B2 *  2/2013  Takahashi ........... F21S 48/1145
                                                           362/293
(Continued)

FOREIGN PATENT DOCUMENTS

JP   2005-150041   6/2005
JP   2005-294185   10/2005
(Continued)

OTHER PUBLICATIONS

The Engineering Toolbox, Air Properties,Feb. 12, 2010 http://web.archive.org/web/20100212185300/http://www.engineeringtoolbox.com/air-properties-d_156.html[Dec. 13, 2015 3:11:52 PM].*
(Continued)

*Primary Examiner* — Stephen F Husar
*Assistant Examiner* — Danielle Allen
(74) *Attorney, Agent, or Firm* — Morrison & Foerster LLP

(57) ABSTRACT

A headlamp (1) includes a semiconductor laser (3); a light-emitting element (7) that emits light in response to laser light emitted from the semiconductor laser (3); a heat-conducting member (13) that receives heat generated by the light-emitting element (7) through a light-emitting-element facing surface (13*a*); and a gap layer (15) that is disposed between the light-emitting element (7) and the light-emitting-element facing surface (13*a*) and that conducts the heat generated by the light-emitting element (7) to the light-emitting-element facing surface (13*a*). The gap layer (15) contains at least an inorganic amorphous material.

20 Claims, 9 Drawing Sheets

(51) Int. Cl.

| | | |
|---|---|---|
| F21V 9/00 | (2015.01) | |
| G03B 21/14 | (2006.01) | |
| F21S 8/10 | (2006.01) | |
| F21S 8/04 | (2006.01) | |
| F21V 8/00 | (2006.01) | |
| G03B 21/16 | (2006.01) | |
| G03B 21/20 | (2006.01) | |
| B82Y 20/00 | (2011.01) | |
| F21V 29/00 | (2015.01) | |
| F21V 7/22 | (2006.01) | |
| F21Y 101/02 | (2006.01) | |
| H01S 5/00 | (2006.01) | |
| F21V 29/70 | (2015.01) | |

(52) U.S. Cl.
CPC ............ F21S 48/1241 (2013.01); F21V 9/00 (2013.01); F21V 9/16 (2013.01); G02B 6/0008 (2013.01); G03B 21/14 (2013.01); G03B 21/16 (2013.01); G03B 21/204 (2013.01); B82Y 20/00 (2013.01); F21V 7/22 (2013.01); F21V 29/20 (2013.01); F21V 29/70 (2015.01); F21Y 2101/025 (2013.01); H01S 5/005 (2013.01); Y10S 977/95 (2013.01)

(56) References Cited

U.S. PATENT DOCUMENTS

| | | | | |
|---|---|---|---|---|
| 8,733,993 | B2* | 5/2014 | Takahashi | F21S 48/1145 362/516 |
| 2004/0105275 | A1* | 6/2004 | Sazuka | B60Q 1/04 362/507 |
| 2005/0057542 | A1* | 3/2005 | Plut | G03B 21/00 345/204 |
| 2005/0105301 | A1 | 5/2005 | Takeda et al. | |
| 2006/0279950 | A1 | 12/2006 | Hama et al. | |
| 2007/0080362 | A1 | 4/2007 | Scotch et al. | |
| 2007/0131954 | A1 | 6/2007 | Murayama et al. | |
| 2008/0075406 | A1 | 3/2008 | Kadomi et al. | |
| 2011/0279007 | A1* | 11/2011 | Kishimoto | B60Q 1/0011 313/45 |
| 2012/0057364 | A1 | 3/2012 | Kishimoto et al. | |
| 2012/0119638 | A1* | 5/2012 | Sato | F21V 29/004 313/46 |
| 2014/0168942 | A1* | 6/2014 | Kishimoto | F21S 48/214 362/84 |

FOREIGN PATENT DOCUMENTS

| | | |
|---|---|---|
| JP | 2007-27688 | 2/2007 |
| JP | 2007-335514 | 12/2007 |
| JP | 2008-76798 | 4/2008 |
| JP | 2009-513003 | 3/2009 |
| JP | 2010-229002 | 10/2010 |
| JP | 2011-29432 | 2/2011 |
| JP | 2011-54759 | 3/2011 |
| JP | 2011-243700 | 12/2011 |
| JP | 2012-59452 | 3/2012 |
| JP | 2012-59454 | 3/2012 |

OTHER PUBLICATIONS

Loretta L. Jones, Ceramics, Jan. 11, 2010, https://web.archive.org/web/20100101181005/http://chemistryexplained.com/Bo-Ce/Ceramics.html[Dec. 13, 2015 4:06:47 PM].*

International Search Report mailed May 22, 2012, directed to International Application No. PCT/JP2012/055997; 5 pages.

* cited by examiner

FIG. 15
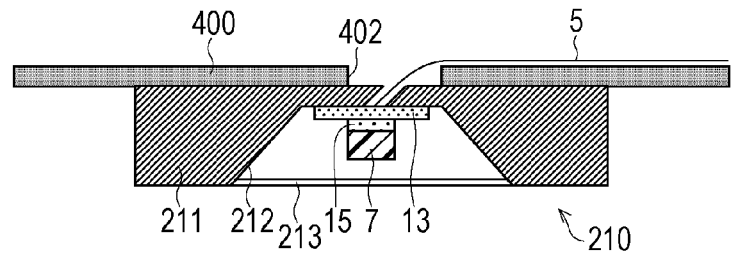
FIG. 16
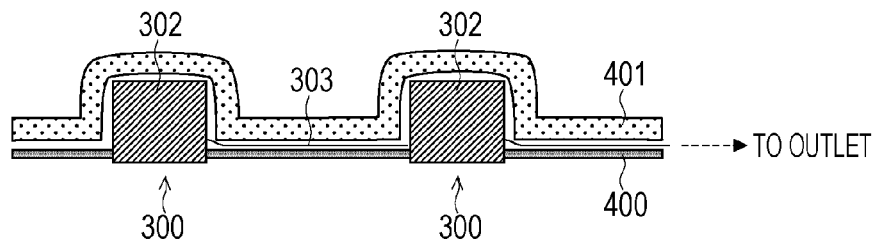
FIG. 17
| | LED DOWNLIGHT 300 | LASER DOWNLIGHT 200 |
|---|---|---|
| OUTER SIZE | 117 mm IN DIAMETER × 91 mm | 60 mm IN DIAMETER × 20 mm |
| EMBEDDING HOLE SIZE | 100 mm IN DIAMETER | 50 mm |
| EMBEDDED FIXTURE HEIGHT | 85 mm | 15 mm |
| MASS | 0.7 Kg | 0.1 Kg |
FIG. 18
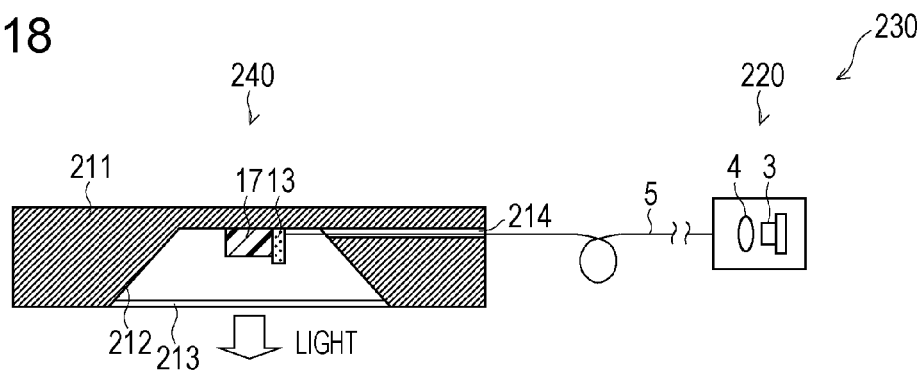

LIGHT-EMITTING APPARATUS, ILLUMINATION SYSTEM, VEHICLE HEADLAMP, PROJECTOR, AND METHOD FOR MANUFACTURING LIGHT-EMITTING APPARATUS

REFERENCE TO RELATED APPLICATIONS

This application is a national stage application under 35 USC 371 of International Application No. PCT/JP2012/055997, filed Mar. 8, 2012, which claims the priority from Japanese Patent Application Nos. 2011-050635, filed Mar. 8, 2011, and 2011-137842, filed Jun. 21, 2011, the entire contents of which are incorporated herein by reference.

FIELD OF THE INVENTION

The present invention relates to sintered light emitters that function as high-intensity light sources, to light-emitting apparatuses including such sintered light emitters, to illumination systems, vehicle headlamps, and projectors including such light-emitting apparatuses, to methods for fabricating sintered light emitters, and to methods for manufacturing light-emitting apparatuses.

BACKGROUND OF THE INVENTION

In recent years, extensive research has been directed to light-emitting apparatuses including a semiconductor light-emitting device, such as a light-emitting diode (LED) or a semiconductor laser (laser diode (LD)), as an excitation light source and a light-emitting element (light emitter) containing a phosphor that emits fluorescence as illumination light when the light-emitting element is irradiated with excitation light emitted from the excitation light source.

An example of the art related to such light-emitting apparatuses is an illumination apparatus disclosed in PTL 1. This illumination apparatus includes a semiconductor laser as an excitation light source to provide a high-intensity light source. Laser light emitted from the semiconductor laser is coherent light with high directivity and can therefore be efficiently collected and utilized. A light-emitting apparatus including a semiconductor laser (hereinafter referred to as "LD light-emitting apparatus") as an excitation light source is suitable for vehicle headlamps. The use of a semiconductor laser as an excitation light source provides a high-intensity light source that would not otherwise be feasible with LEDs.

If laser light is used as excitation light, the temperature of the light-emitting element, which is extremely small, i.e., has an extremely small volume, is easily raised by the portion of the excitation light, incident on and absorbed by the light-emitting element, that is converted into heat without being converted into fluorescence by the phosphor. This results in degraded characteristics of and thermal damage to the light-emitting element.

To solve this problem, the invention in PTL 2 includes a light-transmissive plate-shaped heat-conducting member thermally connected to a wavelength-converting member (corresponding to a light-emitting element) to reduce the heat generated by the wavelength-converting member.

The invention in PTL 3 includes a cylindrical ferrule holding a wavelength-converting member and a wire-shaped heat-conducting member thermally connected to the ferrule to reduce the heat generated by the wavelength-converting member.

The invention in PTL 4 includes a heat-dissipating member disposed on the side of a light-converting member (corresponding to a light-emitting element) facing semiconductor light-emitting devices and having a passage through which refrigerant flows to cool the light-converting member.

PTL 5 discloses a structure in which a light-transmissive heatsink is thermally connected to a surface of a high-power LED chip used as a light source to cool the high-power LED.

PATENT LITERATURE

PTL 1: Japanese Unexamined Patent Application Publication No. 2005-150041 (published on Jun. 9, 2005)
PTL 2: Japanese Unexamined Patent Application Publication No. 2007-27688 (published on Feb. 1, 2007)
PTL 3: Japanese Unexamined Patent Application Publication No. 2007-335514 (published on Dec. 27, 2007)
PTL 4: Japanese Unexamined Patent Application Publication No. 2005-294185 (published on Oct. 20, 2005)
PTL 5: Japanese Unexamined Patent Application Publication (Translation of PCT Application) No. 2009-513003 (published on Mar. 26, 2009)
PTL 6: Japanese Unexamined Patent Application Publication No. 2008-76798 (published on Apr. 3, 2008)

SUMMARY OF INVENTION

However, if the heat-conducting member is formed independently of the light-emitting element and is brought into contact with the surface of the light-emitting element, the heat generated by the light-emitting element cannot be efficiently conducted to the heat-conducting member.

Specifically, the light-emitting element and the heat-conducting member have microscopic surface irregularities, which form a relatively large gap therebetween when they are brought into contact with each other. This gap decreases the efficiency of heat conduction from the light-emitting element to the heat-conducting member and thus prevents efficient dissipation of the heat generated by the light-emitting element.

A possible solution is, for example, to bond the light-emitting element and the heat-conducting member with an organic resin adhesive, as disclosed in PTL 6. The organic resin fills the gap between the light-emitting element and the heat-conducting member, thereby increasing the effective contact area between the light-emitting element and the heat-conducting member. This is expected to allow the heat generated by the light-emitting element to be efficiently conducted to the heat-conducting member.

Bonding the light-emitting element and the heat-conducting member with an organic resin, however, has the following new problem.

Specifically, the organic resin has low thermal conductivity. Even if the organic resin fills the gap between the light-emitting element and the heat-conducting member, the organic resin cannot efficiently conduct the heat generated by the light-emitting element to the heat-conducting member and therefore cannot provide a sufficient heat dissipation effect.

In particular, organic resins are susceptible to heat and thus readily lose their light transmissivity in high-temperature environments. A colored or discolored organic resin absorbs the light emitted from the light-emitting element, which results in decreased energy availability.

In view of the foregoing problems, an object of the present invention is to provide a light-emitting apparatus, illumination system, vehicle headlamp, and projector that can efficiently dissipate heat generated by a light-emitting element (light emitter) and a method for manufacturing such a light-emitting apparatus.

To solve the foregoing problems, a light-emitting apparatus according to the present invention includes an excitation light source that emits excitation light; a light emitter that emits light in response to the excitation light emitted from the excitation light source; a heat-conducting member that has a light-emitter facing surface facing the light emitter and that receives heat generated by the light emitter through the light-emitter facing surface; and a gap layer that is disposed between the light emitter and the light-emitter facing surface and that conducts the heat generated by the light emitter to the light-emitter facing surface. The gap layer contains at least an inorganic amorphous material.

In the above structure, the gap layer conducts the heat generated by the light emitter when the light emitter emits light in response to the excitation light through the light-emitter facing surface to the heat-conducting member to dissipate the heat generated by the light emitter.

The gap layer fills the gap between the light emitter and the light-emitter facing surface, thereby increasing the effective thermal contact area between the light emitter and the heat-conducting member. The gap layer can therefore efficiently conduct the heat generated by the light emitter to the heat-conducting member.

Because the inorganic amorphous material has high thermal conductivity, the thermal resistance of the gap layer is about one tenth that of, for example, a gap layer formed of an organic material such as resin. The gap layer, containing the inorganic amorphous material, can therefore conduct the heat generated by the light emitter to the heat-conducting member without limiting the rate thereof.

Thus, the above structure can efficiently dissipate the heat generated by the light emitter and can also prevent a decrease in the luminous efficiency of the light emitter, thereby reducing degradation of the light emitter.

Because the inorganic amorphous material is resistant to higher temperatures than organic materials, the inorganic amorphous material can maintain the function of conducting the heat generated by the light emitter to the heat-conducting member when the light emitter is at higher temperatures. The above structure can therefore improve the reliability of the light-emitting apparatus in high-temperature environments.

The use of the inorganic amorphous material offers a wider range of material options to form a gap layer having sufficient light transmissivity in the visible wavelength region than, for example, inorganic crystalline materials and also causes little diffusion of the excitation light or the light emitted from the light emitter at crystal grain boundaries. The above structure therefore allows an optimum material to be selected to form a gap layer having characteristics suitable for the application and high light availability.

Thus, the present invention can provide a light-emitting apparatus that can efficiently dissipate heat generated by a light emitter.

As described above, the light-emitting apparatus according to the present invention includes the excitation light source that emits excitation light; the light emitter that emits light in response to the excitation light emitted from the excitation light source; the heat-conducting member that has the light-emitter facing surface facing the light emitter and that receives heat generated by the light emitter through the light-emitter facing surface; and the gap layer that is disposed between the light emitter and the light-emitter facing surface and that conducts the heat generated by the light emitter to the light-emitter facing surface. The gap layer contains an inorganic amorphous material.

Thus, the present invention offers the advantage of providing a light-emitting apparatus that can efficiently dissipate heat generated by a light emitter.

BRIEF DESCRIPTION OF DRAWINGS

FIG. 15 is a sectional view showing a modification of the method for installing the laser downlight shown in FIG. 14.

FIG. 16 is a sectional view of a ceiling in which conventional LED downlights are installed.

FIG. 17 is a table comparing the specifications of the laser downlight according to the fourth embodiment with the specifications of the conventional LED downlight.

FIG. 18 is a sectional view showing a modification of the laser downlight shown in FIG. 14.

DETAILED DESCRIPTION OF THE INVENTION

First Embodiment

An embodiment of the present invention will now be described with reference to FIGS. 1 to 5($d$). This embodiment illustrates an automotive headlamp (vehicle headlamp) 1 as an example of an illumination system including a light-emitting apparatus according to the present invention.

It is to be understood, however, that the illumination system according to the present invention may also be implemented as headlamps for vehicles and moving objects other than automobiles (e.g., humans, ships, aircraft, submarines, and rockets) or as other illumination systems. Examples of such other illumination systems include searchlights, projectors, household lighting fixtures, indoor lighting fixtures, and outdoor lighting fixtures.

The headlamp 1 may comply with light distribution characteristics standards for main-beam headlamps (high beams) or light distribution characteristics standards for dipped-beam headlamps (low beams).

(Structure of Headlamp 1)

Figure 1:
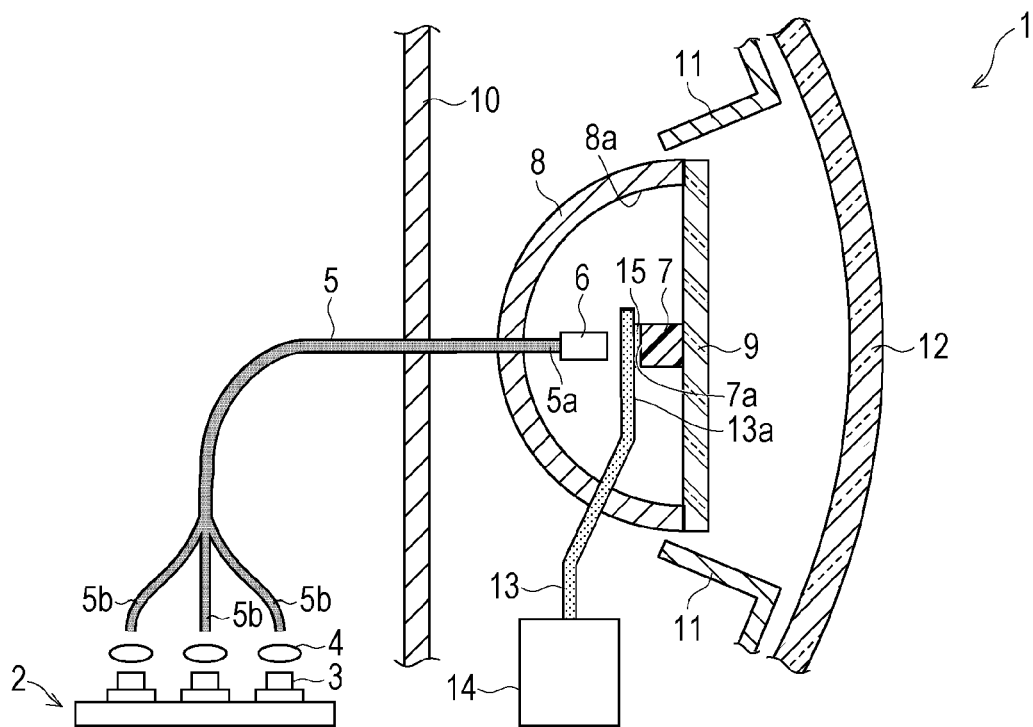
FIG. 1 is a sectional view showing the structure of a headlamp according to a first embodiment.

The structure of the headlamp 1 will be described first with reference to FIG. 1. FIG. 1 is a sectional view showing the structure of the headlamp 1. As shown in FIG. 1, the headlamp 1 includes a semiconductor laser array 2, aspherical lenses 4, optical fibers 5, a ferrule 6, a light-emitting element 7, a reflective mirror 8, a transparent plate 9, a housing 10, an extension 11, a lens 12, a heat-conducting member 13, a cooling element 14, and a gap layer 15.

Figure 2:
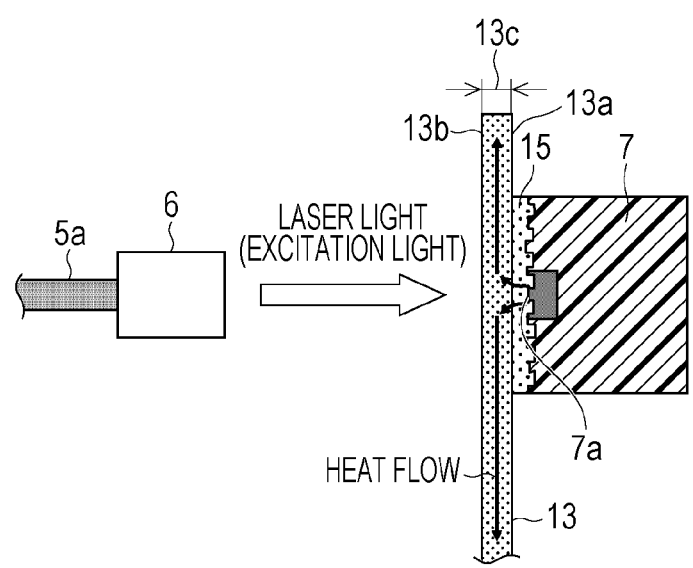
FIG. 2 is an enlarged view showing a structure in which a light-emitting element and a heat-conducting member are bonded with a gap layer in the headlamp shown in FIG. 1.
Figure 3:
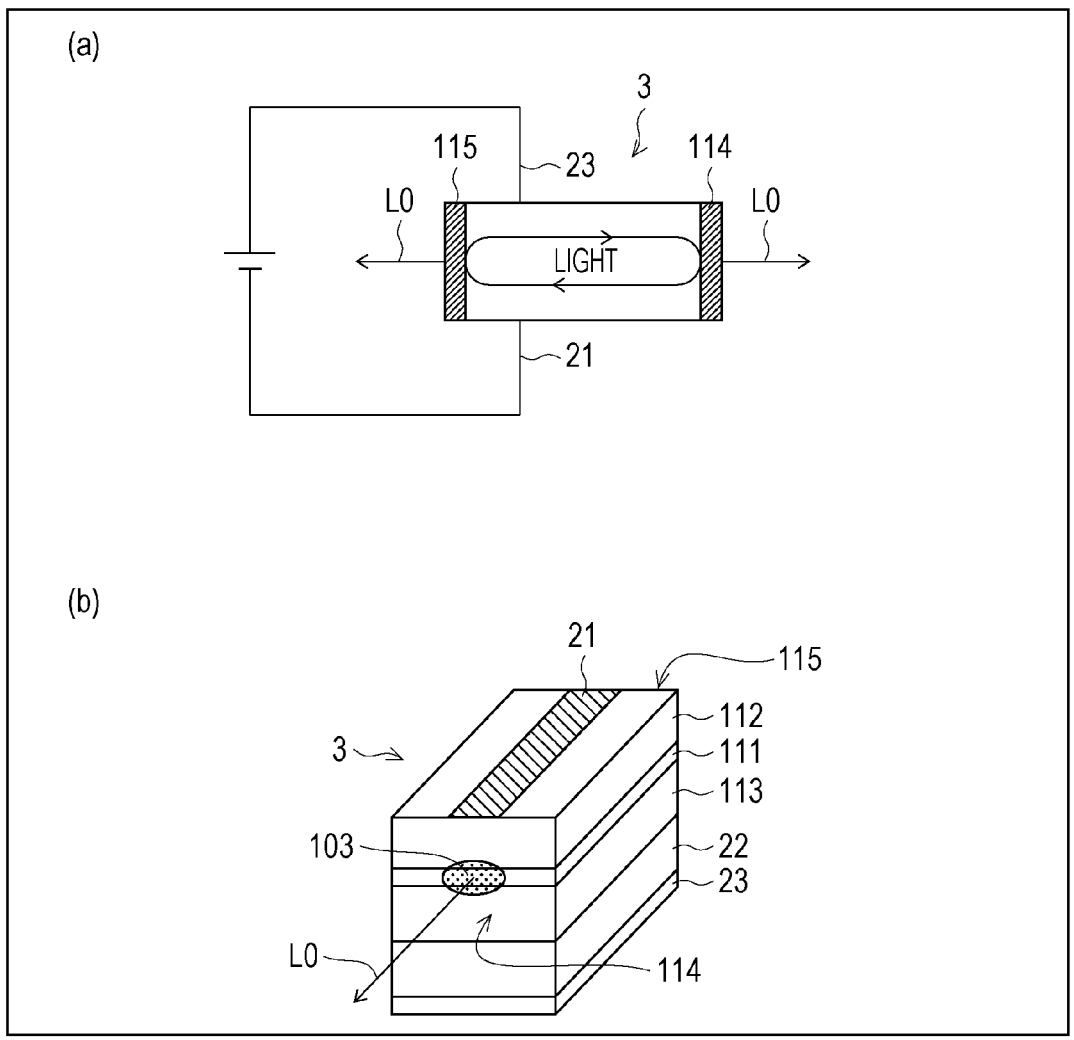
FIG. 3($a$) is a schematic diagram showing the circuit of a semiconductor laser, and FIG. 3($b$) is a perspective view showing the basic structure of the semiconductor laser.

FIG. 2 is an enlarged view showing a structure in which the light-emitting element 7 and the heat-conducting member 13 are bonded with the gap layer 15 in FIG. 1. As shown in FIG. 2, the gap layer 15 fills the gap between the heat-conducting member 13 and the light-emitting element 7 and functions to efficiently conduct heat generated by the light-emitting element 7 to the heat-conducting member 13.

(Semiconductor Laser Array 2/Semiconductor Lasers 3)

The semiconductor laser array 2 functions as an excitation light source that emits excitation light and includes a plurality of semiconductor lasers (excitation light source) 3 disposed on a substrate. Each of the semiconductor lasers 3 emits laser light as excitation light.

The excitation light source need not necessarily be a plurality of semiconductor lasers 3, but may be a single semiconductor laser 3, although high-power laser light can be more easily obtained using a plurality of semiconductor lasers 3.

The semiconductor lasers 3 have one light-emitting point per chip and emit laser light at, for example, 405 nm (blue-violet). The semiconductor lasers 3 operate at a power of 1.0 W, a voltage of 5 V, and a current of 0.6 A and is sealed in a package with a diameter of 5.6 mm. The laser light emitted from the semiconductor lasers 3 is not limited to 405 nm, but may have a peak wavelength in other wavelength ranges. For example, the laser light emitted from the semiconductor lasers 3 may have a peak wavelength in the wavelength range of 380 to 470 nm.

The semiconductor lasers 3 used in this embodiment may be semiconductor lasers designed to emit laser light at a wavelength shorter than 380 nm if it is possible to fabricate high-quality semiconductor lasers 3 for shorter wavelengths that emit laser light at a wavelength shorter than 380 nm.

Although the excitation light source used in this embodiment is the semiconductor lasers 3, the semiconductor lasers 3 may be replaced by light-emitting diodes (LEDs).

(Aspherical Lenses 4)

The aspherical lenses 4 are lenses through which the laser light emitted from the semiconductor lasers 3 enters input ends 5b of the optical fibers 5. The aspherical lenses 4 may be, for example, FLKN1 405 available from Alps Electric Co., Ltd. The aspherical lenses 4 may be formed in any shape using any material, provided that they have the above function, although it is preferred to use a material having high transmittance in the wavelength region around the wavelength of the excitation light, i.e., 405 nm, and high heat resistance.

(Optical Fibers 5)

(Arrangement of Optical Fibers 5)

The optical fibers 5 are a bundle of optical fibers serving as light-guide members that guide the laser light emitted from the semiconductor lasers 3 to the light-emitting element 7. The optical fibers 5 have a plurality of input ends 5b that receive the laser light and a plurality of output ends 5a that output the laser light entering the input ends 5b. The plurality of output ends 5a direct the laser light onto different regions of a laser-light irradiation surface 7a of the light-emitting element 7.

For example, the output ends 5a of the plurality of optical fibers 5 are arranged in a plane parallel to the laser-light irradiation surface 7a. With this arrangement, the portion with the highest light intensity of the light intensity distribution of the laser light emitted from each output end 5a (the central portion of the irradiation region formed on the laser-light irradiation surface 7a by the laser light (maximum-light-intensity portion)) is directed onto a different portion of the laser-light irradiation surface 7a of the light-emitting element 7. This allows the laser light to be spread out in a two-dimensional plane over the laser-light irradiation surface 7a of the light-emitting element 7.

Thus, the above arrangement can prevent significant degradation of a portion of the light-emitting element 7 due to local irradiation of the light-emitting element 7 with the laser light.

The optical fibers 5 need not necessarily be a bundle of optical fibers (i.e., a structure having a plurality of output ends 5a), but may be a single optical fiber 5 (i.e., a structure having a single output end 5a).

(Material and Structure of Optical Fibers 5)

The optical fibers 5 have a double-layer structure in which a central core is covered by a cladding having a lower refractive index than the core. The core contains a major proportion of quartz glass (silicon oxide) with little laser light absorption loss, whereas the cladding contains a major proportion of quartz glass or synthetic resin material having a lower refractive index than the core.

For example, the optical fibers 5 are formed of quartz and have a core diameter of 200 μm, a cladding diameter of 240 μm, and a numerical aperture NA of 0.22, although the optical fibers 5 are not limited to the structure, thickness, and material described above. For example, the optical fibers 5 may be rectangular in a cross-section perpendicular to the longitudinal direction thereof.

The optical fibers 5 are flexible so that the arrangement of the output ends 5a can be easily changed relative to the laser-light irradiation surface 7a of the light-emitting element 7. The output ends 5a can therefore be arranged along the shape of the laser-light irradiation surface 7a of the light-emitting element 7 to mildly irradiate the entire laser-light irradiation surface 7a of the light-emitting element 7 with the laser light.

The flexibility of the optical fibers 5 also allows the positions of the semiconductor lasers 3 and the light-emitting element 7 to be easily changed relative to each other. By adjusting the length of the optical fibers 5, therefore, the semiconductor lasers 3 can be disposed at a position remote from the light-emitting element 7.

Thus, the design flexibility of the headlamp 1 can be improved. For example, the semiconductor lasers 3 can be disposed at a position where they can be easily cooled or replaced. That is, the design flexibility of the headlamp 1 can be improved because the positions of the input ends 5b and the output ends 5a can be easily changed relative to each other and also because the positions of the semiconductor lasers 3 and the light-emitting element 7 can be easily changed relative to each other. Accordingly, the design flexibility of an automobile equipped with the headlamp 1 according to this embodiment can be improved.

Alternatively, light-guide members other than optical fibers or a combination of optical fibers and other light-guide members may be used. For example, one or more frusto-conical (or frusto-pyramidal) light-guide members having input and output ends for laser light may be used.

(Ferrule 6)

The ferrule 6 holds the plurality of output ends 5a of the optical fibers 5 in a predetermined pattern relative to the laser-light irradiation surface 7a of the light-emitting element 7. The ferrule 6 may have a predetermined pattern of holes through which the output ends 5a are inserted. Alternatively, the ferrule 6 may be separable into upper and lower segments, and the output ends 5a may be held between grooves formed in the joint surfaces of the upper and lower segments.

The ferrule 6 may be fixed to the reflective mirror 8 with, for example, a bar-shaped or cylindrical member extending from the reflective mirror 8, or may be fixed to the heat-conducting member 13. The ferrule 6 may be formed of any material, such as stainless steel. A plurality of ferrules 6 may be provided for one light-emitting element 7.

The ferrule 6 may be omitted if there is only one output end 5a of an optical fiber 5. The ferrule 6, however, is preferably provided in order to accurately set the position of the output end 5a relative to the laser-light irradiation surface 7a.

(Light-Emitting Element 7)
(Composition of Light-Emitting Element 7)

Figure 7:
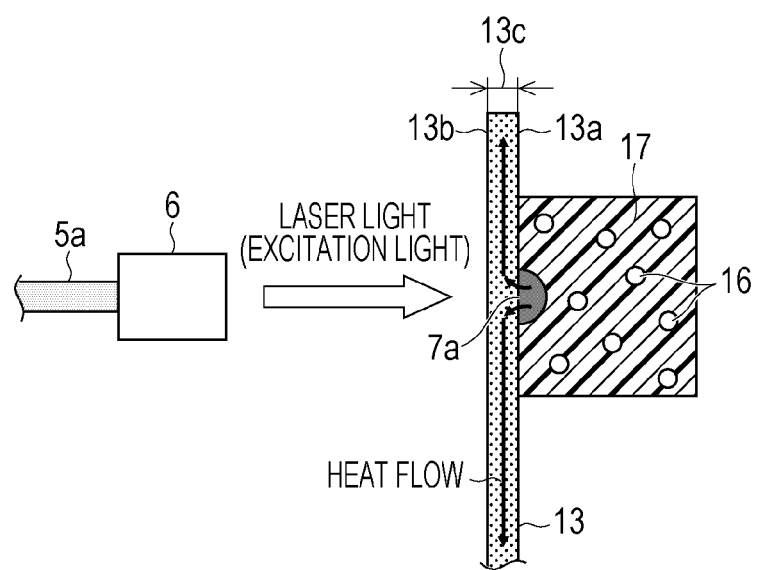
FIG. 7 is an illustration showing the details of a light-emitting element and a heat-conducting member of a headlamp according to a third embodiment.

The light-emitting element (light emitter) 7 emits light in response to the laser light output from the output ends 5a and contains phosphor particles that emit light in response to the laser light (see component number 16 in FIG. 7). As shown in FIG. 2, the light-emitting element 7 is fixed to the surface of the heat-conducting member 13 opposite the surface thereof to be irradiated with the laser light, i.e., a light-emitting-element facing surface (light-emitter facing surface) 13a facing the light-emitting element 7, with the gap layer 15 therebetween.

The light-emitting element 7 contains a phosphor dispersed in an inorganic glass used as a phosphor-supporting material (sealing material). The ratio of the inorganic glass to the phosphor is about 10:1.

The phosphor-supporting material is not limited to materials such as inorganic glasses. The phosphor-supporting material may be a resin or organic-inorganic hybrid glass having sufficient heat resistance and thermal conductivity to withstand the heat generated when the phosphor is excited by the laser light. Alternatively, the light-emitting element 7 may be formed by compacting a phosphor or by sintering phosphor particles.

The phosphor is preferably, for example, an oxynitride or nitride phosphor. Oxynitride phosphors and nitride phosphors have high heat resistance, thus improving the reliability of the headlamp 1 in high-temperature environments.

Oxynitride phosphors and nitride phosphors also exhibit a relatively small decrease in luminous efficiency due to a temperature rise. This allows the headlamp 1 to efficiently emit illumination light in high-temperature environments.

The light-emitting element 7 contains, for example, one or more of phosphors that emit blue light, green light, and red light, which are dispersed in the inorganic glass. Because the semiconductor lasers 3 emit laser light at 405 nm (blue-violet), the light-emitting element 7, when irradiated with the laser light, emits white light as a result of mixing of different colors. The light-emitting element 7 thus functions as a wavelength-converting material.

Alternatively, the semiconductor lasers 3 may emit laser light at 450 nm (blue) (or light having a peak wavelength in the wavelength range of 440 to 490 nm, i.e., laser light near "blue"). In this case, the phosphor is a yellow phosphor or a mixture of green and red phosphors.

Yellow phosphors are phosphors that emit light having a peak wavelength in the wavelength range of 560 to 590 nm. Green phosphors are phosphors that emit light having a peak wavelength in the wavelength range of 510 to 560 nm. Red phosphors are phosphors that emit light having a peak wavelength in the wavelength range of 600 to 680 nm.

(Type of Phosphor)

The light-emitting element 7 preferably contains an oxynitride phosphor, a nitride phosphor, or a group III-V compound semiconductor nanoparticle phosphor. These materials are highly resistant to the laser light emitted from the semiconductor lasers 3, which has extremely high intensity (extremely high power and optical density), and are suitable for laser illumination light sources. Nanoparticle phosphors have particle sizes that are about two orders of magnitude shorter than the wavelength of light in the visible wavelength region.

Typical oxynitride phosphors include those commonly termed SiAlON phosphors. SiAlON phosphors are silicon nitrides in which some of the silicon atoms are replaced by aluminum atoms and some of the nitride atoms are replaced by oxygen atoms. SiAlON phosphors can be prepared by dissolving alumina ($Al_2O_3$), silica ($SiO_2$), and other ingredients such as rare earth elements in silicon nitride ($Si_3N_4$).

One of the characteristics of semiconductor nanoparticle phosphors is that the color of the light emitted from the same compound semiconductor (for example, indium phosphide (InP)) can be changed by a quantum size effect, which appears when the particle size is changed to the nanometer size range. For example, InP emits red light when the particle size is about 3 to 4 nm (the particle size was evaluated by transmission electron microscopy (TEM)).

Another characteristic of semiconductor nanoparticle phosphors is that they are based on semiconductors and therefore have short fluorescence lifetimes, which allow them to quickly radiate the power of the excitation light as fluorescence, thus providing high resistance to high-power excitation light. This is because semiconductor nanoparticle phosphors have emission lifetimes of about 10 nanoseconds, which are five orders of magnitude smaller than those of common phosphor materials containing rare earths as emission centers.

Because semiconductor nanoparticle phosphors have short emission lifetimes, as described above, they can quickly repeat absorption of laser light and emission of light. This maintains high efficiency for intense laser light and therefore reduces the heat generated by the phosphor.

Thus, the light-emitting element 7 is more resistant to thermal deterioration (such as discoloration and deformation). This extends the lifetime of a light-emitting apparatus including a light-emitting device having high optical power as a light source.

The phosphor is not necessarily an oxynitride phosphor, nitride phosphor, or group III-V compound semiconductor nanoparticle phosphor, as described above, but may be formed of other suitable materials.

(Shape and Size of Light-Emitting Element 7)

The light-emitting element 7 is, for example, a cylinder having a diameter of 3.2 mm and a thickness of 1 mm. The bottom surface of the cylinder, i.e., the laser-light irradiation surface 7a, receives the laser light output from the output ends 5a.

Rather than a cylinder, the light-emitting element 7 may be, for example, a cuboid, truncated cone, or truncated pyramid. For example, the light-emitting element 7 may be a cuboid having a size of 2 mm×2 mm×1 mm in thickness. In this case, the laser-light irradiation surface 7a, which receives the laser light from the semiconductor lasers 3, has an area of 4 mm$^2$.

Alternatively, the light-emitting element 7 may be, for example, a cuboid having a size of 3 mm×1 mm×1 mm in thickness. If the light-emitting element 7 is elongated in the horizontal direction (substantially rectangular in cross-section), it can easily achieve the light distribution pattern (light distribution) for vehicle headlamps stipulated by law in Japan, which is narrower in the vertical direction and is wider in the horizontal direction.

The required thickness of the light-emitting element 7 varies with the ratio of the phosphor-supporting material to the phosphor in the light-emitting element 7. A light-emitting element 7 with a higher phosphor content has a higher conversion efficiency from laser light to white light and can therefore be made thinner. A thinner light-emitting element 7 has a lower thermal resistance and can therefore dissipate more heat to the heat-conducting member 13. An extremely thin light-emitting element 7, however, has a low rate of conversion from laser light to fluorescence.

The light-emitting element 7 preferably has a thickness that is at least ten times or more the particle size of the phosphor for sufficient absorption of the excitation light by the phosphor. Hence, a light-emitting element containing a semiconductor nanoparticle phosphor preferably has a thickness of 0.01 μm or more. In terms of the ease of the manufacturing process, including dispersing the phosphor in the sealing material, the light-emitting element 7 preferably has a thickness of 10 μm or more, i.e., 0.01 mm or more. An extremely thick light-emitting element 7, however, results in a considerable deviation from the focus of the reflective mirror 8, thus blurring the light distribution pattern.

Thus, if the phosphor is an oxynitride phosphor or nitride phosphor, the light-emitting element 7 preferably has a thickness of 0.2 to 2 mm. The lower limit of thickness does not apply, however, if the phosphor content is extremely high (typically, 100% phosphor).

The laser-light irradiation surface 7a of the light-emitting element 7 need not necessarily be flat, but may be curved. To reduce reflection of the laser light, however, the laser-light irradiation surface 7a is preferably flat. If the laser-light irradiation surface 7a is curved, the angle of incidence on the curved surface varies largely depending on the position irradiated with the laser light, and consequently, the direction in which the reflected light travels varies largely. This might make it difficult to control the direction in which the laser light is reflected. If the laser-light irradiation surface 7a is flat, the direction in which the laser light is reflected can be easily controlled because the direction in which the reflected light travels remains substantially the same even if the position irradiated with the laser light deviates slightly. In some cases, a measure such as placing a laser light absorber at a site on which the reflected light impinges can be easily taken.

The laser-light irradiation surface 7a need not necessarily be perpendicular to the optical axis of the laser light. If the laser-light irradiation surface 7a is perpendicular to the optical axis of the laser light, the reflected laser light returns toward the semiconductor lasers 3 and might damage the semiconductor lasers 3.

The headlamp 1 may be configured to output illumination light containing only the fluorescence emitted from the phosphor. This provides safe illumination light.

Alternatively, the headlamp 1 may be configured to output illumination light containing the laser light emitted from the semiconductor lasers 3 and the fluorescence emitted from the phosphor. That is, a portion of the laser light emitted from the semiconductor lasers 3 may be used as illumination light without wavelength conversion by the light-emitting element 7. A suitable combination of the laser light and the fluorescence can be selected so that the headlamp 1 outputs illumination light of the desired color.

(Reflective Mirror 8)

The reflective mirror 8 reflects the light emitted from the light-emitting element 7 to form a pencil of rays traveling within a predetermined solid angle. Specifically, the reflective mirror 8 reflects the light emitted from the light-emitting element 7 to form a pencil of rays traveling frontward of the headlamp 1. The reflective mirror 8 is, for example, a curved (cup-shaped) member on which a thin metal film is formed.

(Transparent Plate 9)

The transparent plate 9 is a transparent or translucent plate covering an opening 8a of the reflective mirror 8. In this embodiment, the transparent plate 9 is used together with the heat-conducting member 13 to fix the light-emitting element 7. Specifically, the light-emitting element 7 is held between the heat-conducting member 13 and the transparent plate 9 to fix the light-emitting element 7. In this case, the transparent plate 9 functions as a fixing element that fixes the positions of the light-emitting element 7 and the heat-conducting member 13 relative to each other. Because the light-emitting element 7 is held between the heat-conducting member 13 and the transparent plate 9, the position of the light-emitting element 7 can be more reliably fixed even if the gap layer 15 has low adhesion.

The transparent plate 9 may be formed of a material such as resin or glass. Preferably, the transparent plate 9 is formed of an inorganic glass material with high thermal conductivity, which provides a large heat dissipation effect.

If the headlamp 1 is configured to output illumination light containing only the fluorescence emitted from the phosphor, the transparent plate 9 is preferably formed of a material that blocks the laser light emitted from the semiconductor lasers 3 and that transmits the fluorescence generated by wavelength conversion of the laser light by the light-emitting element 7. In this case, most of the coherent laser light is converted into fluorescence by the light-emitting element 7 or is scattered or diffused by the phosphor contained in the light-emitting element 7. It is possible, however, that a portion of the laser light is not converted, scattered, or diffused for some reason. In such cases, the transparent plate 9 blocks the laser light and prevents it from leaking out.

The transparent plate 9 may be omitted if the light-emitting element 7 is fixed only with the heat-conducting member 13.

(Housing 10)

The housing 10 forms the main body of the headlamp 1 and accommodates the components such as the reflective mirror 8. The optical fibers 5 extend into the housing 10, and the semiconductor laser array 2 is disposed outside the housing 10. The semiconductor laser array 2, which generates heat while emitting laser light, can be efficiently cooled because it is disposed outside the housing 10. This prevents, for example, degraded characteristics of and thermal damage to the light-emitting element 7 due to the heat generated by the semiconductor laser array 2.

The semiconductor lasers 3 are preferably disposed at a position where they can be easily replaced in case of a failure. The semiconductor laser array 2 may be accommodated in the housing 10 unless the above points are considered.

(Extension 11)

The extension 11 is disposed beside the front of the reflective mirror 8 to hide the inner structure of the headlamp 1, thereby improving the appearance of the headlamp 1 and the sense of integration between the reflective mirror 8 and the car body. The extension 11, like the reflective mirror 8, is a member on which a thin metal film is formed.

(Lens 12)

The lens 12 is disposed in an opening of the housing 10 to seal the headlamp 1. The illumination light emitted from the light-emitting element 7 and reflected by the reflective mirror 8 is output through the lens 12 forward of the headlamp 1.

(Heat-Conducting Member 13)

The heat-conducting member 13 is a member with high thermal conductivity that receives the heat generated by the light-emitting element 7 and is thermally connected to the light-emitting element 7 (i.e., so that they can exchange thermal energy).

The heat-conducting member 13 is a plate-shaped member having one end thereof in thermal contact with the laser-light irradiation surface 7a of the light-emitting element 7 and the other end thereof thermally connected to the cooling element 14.

In this embodiment, as shown in FIG. 2, the heat-conducting member 13 has a light-emitting-element facing surface 13a facing the light-emitting element 7. The laser-light irradiation surface 7a of the light-emitting element 7 is bonded to the light-emitting-element facing surface 13a with the gap layer 15.

The heat-conducting member 13 thus shaped and connected holds the light-emitting element 7, which is extremely small, at a light-emitting-element fixing position on the light-emitting-element facing surface 13a while dissipating the heat generated by the light-emitting element 7 outside the headlamp 1.

To efficiently conduct the heat generated by the light-emitting element 7, the heat-conducting member 13 preferably has a thermal conductivity of 20 W/mK or more. In addition, the heat-conducting member 13 is preferably formed of a material with superior light transmissivity because the laser light emitted from the semiconductor lasers 3 passes through the heat-conducting member 13 to reach the laser-light irradiation surface 7a of the light-emitting element 7.

In view of the above points, the heat-conducting member 13 is preferably formed of sapphire ($Al_2O_3$), magnesia (MgO), gallium nitride (GaN), or spinel ($MgAl_2O_4$). These materials provide a heat-conducting member 13 having a thermal conductivity of 20 W/mK or more.

The thickness of the heat-conducting member 13, indicated by reference sign 13c in FIG. 2 (the thickness between the light-emitting-element facing surface 13a and the surface 13b facing the light-emitting-element facing surface 13a of the heat-conducting member 13), is preferably 0.3 to 5.0 mm. If the heat-conducting member 13 has a thickness of less than 0.3 mm, the heat generated by the light-emitting element 7 cannot be sufficiently dissipated and might therefore degrade the light-emitting element 7. If the heat-conducting member 13 has a thickness of more than 5.0 mm, the heat-conducting member 13 absorbs much laser light and therefore significantly decreases the availability of the excitation light.

If a heat-conducting member 13 having a suitable thickness is brought into contact with the light-emitting element 7 with the gap layer 15 therebetween, the heat-conducting member 13 can quickly and efficiently dissipate the heat generated by the light-emitting element 7, particularly when irradiated with extremely intense laser light that causes the light-emitting element 7 to generate heat at more than 1 W. This prevents damage (degradation) to the light-emitting element 7.

The heat-conducting member 13 may be plate-shaped without a bend or may be bent or curved, although the light-emitting-element facing surface 13a, to which the light-emitting element 7 is bonded, is preferably flat (plate-shaped) for stable adhesion.

To improve the heat absorption effect and the heat dissipation effect of the heat-conducting member 13, the following changes are effective:

increase the heat dissipation area (contact area with the light-emitting element 7);

increase the thickness of the heat-conducting member 13; and increase the thermal conductivity of the heat-conducting member 13, for example, using a material with high thermal conductivity or by providing a member with high thermal conductivity (e.g., a thin film or plate-shaped member) on the heat-conducting member 13.

Forming a member such as a thin metal film on the heat-conducting member 13, however, might decrease the luminous flux. Coating the heat-conducting member 13 or providing another member thereon increases the manufacturing costs.

(Modification of Heat-Conducting Member 13)

The heat-conducting member 13 may include a light-transmissive portion (light-transmitting portion) and a non-light-transmissive portion (light-shielding portion). In this structure, the light-transmitting portion is disposed at the interface between the heat-conducting member 13 and the gap layer 15, and the light-shielding portion is disposed outside the light-transmitting portion.

The light-shielding portion may be a heat-dissipating part formed of a metal (such as copper or aluminum) or may be a film capable of reflecting illumination light, such as an aluminum or silver film, formed on a light-transmissive member.

(Cooling Element 14)

The cooling element 14 is a member that cools the heat-conducting member 13, such as a heat-dissipating block with high thermal conductivity formed of a metal such as aluminum or copper. If the reflective mirror 8 is formed of metal, the reflective mirror 8 may be used as the cooling element 14.

Alternatively, the cooling element 14 may be a cooling device that cools the heat-conducting member 13 with a coolant circulated through the cooling device or may be a cooling device (fan) that cools the heat-conducting member 13 with air.

If the cooling element 14 is implemented as a metal block, a plurality of heat-dissipating fins may be arranged on the top surface of the metal block. This structure increases the surface area of the metal block, thus allowing heat to be more efficiently dissipated from the metal block.

The cooling element 14 is not essential for the headlamp 1; the heat received from the light-emitting element 7 may be spontaneously dissipated from the surface of the heat-conducting member 13. If the cooling element 14 is provided, however, heat can be efficiently dissipated from the heat-conducting member 13. The cooling element 14 is particularly effective if the light-emitting element 7 generates heat at 3 W or more.

The cooling element 14 can be installed at a position remote from the light-emitting element 7 by adjusting the length of the heat-conducting member 13. In this case, the cooling element 14 is not necessarily accommodated in the housing 10, as shown in FIG. 1, but may be installed outside the housing 10, with the heat-conducting member 13 extending into the housing 10.

Thus, the cooling element 14 can be installed at a position where it can be easily repaired or replaced when it fails, and the design flexibility of the headlamp 1 can also be improved.

(Gap Layer 15)

The gap layer 15 is an adhesive layer filling the gap between the heat-conducting member 13 and the light-emitting element 7. The light-emitting element 7 has microscopic surface irregularities. One of the causes of these irregularities is the phosphor particles contained in the light-emitting element 7. The light-emitting element 7 typically contains a phosphor having an average particle size of 1 to 30 μm. For example, if the light-emitting element 7 is brought into contact with a polished sapphire heat-conducting member 13, the surface irregularities of the light-emitting element 7 form a relatively large gap therebetween. This gap can be filled by forming the gap layer 15 between the heat-conducting member 13 and the light-emitting element 7.

The gap layer 15 increases the effective contact area between the heat-conducting member 13 and the light-emitting element 7, thus improving the heat absorption efficiency of the heat-conducting member 13. The heat absorption efficiency of the heat-conducting member 13 can be further improved if the gap layer 15 has a similar or higher thermal conductivity than the light-emitting element 7.

The gap layer 15 of the headlamp 1 according to this embodiment contains a major proportion of an inorganic amorphous material to conduct the heat generated by the light-emitting element 7 to the heat-conducting member 13 without limiting the rate thereof.

The inorganic amorphous material is an inorganic material having an amorphous structure, such as an inorganic glass. For example, the inorganic amorphous material may be an inorganic glass containing $SiO_2$, $P_2O_5$, $GeO_2$, $As_2O_3$, or $B_2O_3$ and an oxide such as an alkali oxide or alkaline earth oxide.

Because the gap layer 15 is formed of the inorganic amorphous material, the thermal resistance of the gap layer 15 is about one tenth that of, for example, a gap layer 15 formed of an organic material such as resin. The gap layer 15 can therefore conduct the heat generated by the light-emitting element 7 to the heat-conducting member 13 without limiting the rate thereof.

Thus, the heat generated by the light-emitting element 7 can be efficiently dissipated, and a decrease in the luminous efficiency of the phosphor contained in the light-emitting element 7 can also be prevented, thereby reducing degradation of the light-emitting element 7.

Because the inorganic amorphous material is resistant to higher temperatures than organic materials, the inorganic amorphous material can maintain the function of conducting the heat generated by the light-emitting element 7 to the heat-conducting member 13 when the light-emitting element 7 is at higher temperatures. This improves the reliability of the headlamp 1 in high-temperature environments.

The use of the inorganic amorphous material offers a wider range of material options to form a gap layer 15 having sufficient light transmissivity in the visible wavelength region than, for example, inorganic crystalline materials and also causes little diffusion of excitation light or fluorescence at crystal grain boundaries. This allows an optimum material to be selected to form a gap layer 15 having characteristics suitable for the application and high light availability.

The gap layer 15 preferably contains an organic binder. If the gap layer 15 contains an organic binder, fine irregularities in the surface of the light-emitting element 7 and the light-emitting-element facing surface 13a can be filled with the inorganic amorphous material or the organic binder.

Thus, the thermal conductivity at the interface between the gap layer 15 and the light-emitting element 7 and the interface between the gap layer 15 and the heat-conducting member 13 can be improved. The gap layer 15 can therefore more efficiently conduct the heat generated by the light-emitting element 7 to the heat-conducting member 13.

In this case, the volume ratio of the inorganic amorphous material to the organic binder in the gap layer 15 is preferably 60:40 to 99.99:0.01.

If the volume ratio of the inorganic amorphous material to the organic binder is 60:40 to 99.99:0.01, the gap layer 15 has a higher thermal conductivity and can therefore more efficiently conduct the heat generated by the light-emitting element 7 to the heat-conducting member 13.

The organic binder may be any organic binder, although an organic binder with high transmittance is preferably used if, as in this embodiment, the light-emitting element 7 is irradiated with the laser light emitted from the semiconductor lasers 3 in the direction from the heat-conducting member 13 toward the light-emitting element 7.

For example, the organic binder may be a 5% low-molecular-weight acrylic resin solution in α-terpineol or a mixture of butyl methacrylate, toluene, and dibutyl phthalate.

The gap layer 15 preferably has a thermal expansion coefficient between the thermal expansion coefficient of the light-emitting element 7 and the thermal expansion coefficient of the heat-conducting member 13. If the gap layer 15 has a thermal expansion coefficient between the thermal expansion coefficient of the light-emitting element 7 and the thermal expansion coefficient of the heat-conducting member 13, the difference in thermal expansion coefficient between the gap layer 15 and the light-emitting element 7 and the difference in thermal expansion coefficient between the gap layer 15 and the heat-conducting member 13 are both smaller than the difference in thermal expansion coefficient between the light-emitting element 7 and the heat-conducting member 13.

Therefore, if the gap layer 15, the light-emitting element 7, and the heat-conducting member 13 expand due to the heat generated by the light-emitting element 7 depending on their respective thermal expansion coefficients, there occur smaller differences in the amount of thermal expansion at the interface between the gap layer 15 and the light-emitting element 7 and at the interface between the gap layer 15 and the heat-conducting member 13. As a result, the mechanical stress at each interface due to the difference in the amount of thermal expansion can be reduced, thus improving the mounting reliability of the headlamp 1.

The gap layer 15 preferably has a refractive index between the refractive index of the light-emitting element 7 and the refractive index of the heat-conducting member 13. If the gap layer 15 has a refractive index between the refractive index of the light-emitting element 7 and the refractive index of the heat-conducting member 13, the difference in refractive index between the gap layer 15 and the light-emitting element 7 and the difference in refractive index between the gap layer 15 and the heat-conducting member 13 are both smaller than the difference in refractive index between the light-emitting element 7 and the heat-conducting member 13.

As a result, the proportion of laser light unavailable for excitation of the phosphor contained in the light-emitting element 7 can be reduced, thus improving the availability of the laser light.

Preferably, at least a portion of the surface of the gap layer 15 facing the light-emitting element 7 is in contact with the light-emitting element 7.

In this case, the contact area at the interface between the light-emitting element 7 and the gap layer 15 can be maximized. The gap layer 15 can therefore efficiently conduct the heat generated by the light-emitting element 7 to the heat-conducting member 13.

The gap layer 15 preferably has a thickness of 1 µm to 1 mm. A thinner gap layer 15 can more efficiently conduct the heat generated by the light-emitting element 7 to the heat-conducting member 13 than a thicker gap layer 15. An extremely thin gap layer 15, however, exhibits degraded characteristics (e.g., thermal conductivity) due to variations in thickness.

For example, the formation of a gap layer 15 having a thickness of less than 1 µm using an inorganic glass requires the use of fine inorganic glass particles having a particle size of less than 1 µm. However, fine inorganic glass particles having a particle size of less than 1 µm are difficult to precisely manufacture. If the gap layer 15 has a thickness of less than 1 µm, the gap layer 15 exhibits degraded characteristics due to variations in thickness.

Fine inorganic glass particles having a particle size of less than 1 µm are also readily contaminated with impurities during the manufacturing process. If the gap layer 15 is formed of such fine inorganic glass particles contaminated with impurities, the gap layer 15 exhibits low light transmissivity.

If the gap layer 15 has a thickness of more than 1 mm, the gap layer 15 cannot efficiently conduct the heat generated by the light-emitting element 7 to the heat-conducting member 13 because of its high thermal resistance. This results in a decrease in the luminous efficiency of the light-emitting element 7 and degradation of the light-emitting element 7 and the gap layer 15 due to an excessive temperature rise in the light-emitting element 7.

Specifically, a typical phosphor has a luminous efficiency of, at most, about 90%. If the light-emitting element 7 is irradiated with laser light at 10 W, the phosphor converts the laser light to heat at not less than 10 W×10%=1 W without converting it to fluorescence. The light-emitting element 7 therefore generates heat at not less than 1 W.

Because nearly all of the heat generated by the light-emitting element 7 is conducted from the gap layer 15 to the heat-conducting member 13, heat is conducted to the gap layer 15 at about 1 W.

A typical inorganic (low-melting-point) glass is resistant to temperatures up to about 300° C. Assuming that the room temperature is 30° C., the acceptable temperature rise in the gap layer 15 is 300° C.−30° C.=270° C. The gap layer 15 therefore requires a thermal resistance of 270° C./1 W=270 K/W or less.

The thermal resistance of an object is calculated by the following equation: thermal resistance=(1/thermal conductivity)×(heat conduction distance/contact area with heat source). The area of the laser-light irradiation surface 7a of the light-emitting element 7 suitable for typical headlamps is, for example, about 4 mm². The thermal conductivity of the glass is about 1 W/mK. By substituting these values into the equation, the "heat conduction distance" is calculated as follows:

$$\text{(heat conduction distance)} = \text{(thermal resistance)} \times$$
$$\text{(thermal conductivity)} \times$$
$$\text{(contact area with heat source)}$$
$$= 270 \text{ K/W} \times 1 \text{ W/mK} \times 4 \text{ mm}^2$$
$$\approx 1 \text{ mm}$$

Thus, if the gap layer 15 has a thickness of more than 1 mm, the gap layer 15 exhibits high thermal resistance and also exhibits low adhesion due to degradation (melting or crystallization). This causes the heat-conducting member 13 to come off the light-emitting element 7 or the gap layer 15 to denitrify due to crystallization, with the result that the gap layer 15 transmits no excitation light and cannot therefore provide the desired illumination light.

For the above reasons, the gap layer 15 preferably has a thickness of 1 µm to 1 mm.

If the gap layer 15 is formed of an acrylic resin, which is an organic material, the gap layer 15 requires a thickness of less than 0.1 mm to achieve low thermal resistance. In contrast, if the gap layer 15 is formed of an inorganic glass, the gap layer 15 may have a thickness of 1 mm for the same thermal resistance. This facilitates formation of the gap layer 15 and also facilitates structural design, thus reducing the development and manufacturing costs.

(Structure of Semiconductor Lasers 3)

Next, the basic structure of the semiconductor lasers 3 will be described. FIG. 3(a) is a schematic diagram showing the circuit of the semiconductor lasers 3, and FIG. 3(b) is a perspective view showing the basic structure of the semiconductor lasers 3. As shown in FIGS. 3(a) and 3(b), the semiconductor lasers 3 include, in order, a cathode 23, a substrate 22, a cladding layer 113, an active layer 111, a cladding layer 112, and an anode 21.

The substrate 22 is a semiconductor substrate. To provide blue to ultraviolet excitation light for exciting the phosphor, the substrate 22 is preferably formed of GaN, sapphire, or SiC. Generally, other examples of materials for substrates for semiconductor lasers include group IV semiconductors such as Si, Ge, and SiC; group III-V compound semiconductors such as GaAs, GaP, InP, AlAs, GaN, InN, InSb, GaSb, and AlN; group II-VI compound semiconductors such as ZnTe, ZnSe, ZnS, and ZnO; oxide insulators such as ZnO, $Al_2O_3$, $SiO_2$, $TiO_2$, $CrO_2$, and $CeO_2$; and nitride insulators such as SiN.

The anode 21 injects a current through the cladding layer 112 into the active layer 111.

The cathode 23 injects a current from the bottom of the substrate 22 through the cladding layer 113 into the active layer 111. To inject a current, the anode 21 and the cathode 23 are forward-biased.

The active layer 111 is held between the cladding layers 113 and 112.

To provide blue to ultraviolet excitation light, the active layer 111 and the cladding layers 112 and 113 may be formed of a mixed crystal semiconductor composed of AlInGaN. In general, active layers and cladding layers of semiconductor lasers are formed of mixed crystal semiconductors containing elements such as Al, Ga, In, As, P, N, and Sb. The active layer 111 and the cladding layers 112 and 113 may be formed of such materials. Alternatively, the active layer 111 and the cladding layers 112 and 113 may be formed of group II-VI compound semiconductors containing elements such as Zn, Mg, S, Se, and Te, including ZnO.

The active layer 111 emits light when a current is injected into the active layer 111. The refractive index difference between the active layer 111 and the cladding layers 112 and 113 causes the emitted light to be confined to the active layer 111.

The active layer 111 has a front cleaved surface 114 and a back cleaved surface 115 facing each other for confinement of light amplified by stimulated emission. The front cleaved surface 114 and the back cleaved surface 115 function as mirrors.

Unlike mirrors, which completely reflect light, the front cleaved surface 114 or the back cleaved surface 115 of the active layer 111 (for illustration purposes, the front cleaved surface 114 in this embodiment) outputs a portion of the light amplified by stimulated emission as excitation light L0. The active layer 111 may form a multilayer quantum well structure.

A reflective film for laser emission (not shown) is formed on the back cleaved surface 115 facing the front cleaved surface 114 to provide a difference in reflectance between the front cleaved surface 114 and the back cleaved surface 115. The end surface with the lower reflectance, for example, the front cleaved surface 114, can output most of the excitation light L0 from a light-emitting point 103.

The cladding layers 113 and 112 may be formed of an n-type or p-type group III-V compound semiconductor such as GaAs, GaP, InP, AlAs, GaN, InN, InSb, GaSb, or AlN or an n-type or p-type group II-VI compound semiconductor such as ZnTe, ZeSe, ZnS, or ZnO. The cladding layers 113 and 112 are configured to inject a current into the active layer 111 when the anode 21 and the cathode 23 are forward-biased.

The semiconductor layers, such as the cladding layers 113 and 112 and the active layer 111, may be formed by a common deposition process such as metal-organic chemical vapor deposition (MOCVD), molecular beam epitaxy (MBE), chemical vapor deposition (CVD), laser ablation, or sputtering. The metal layers may be formed by a common deposition process such as evaporation, plating, laser ablation, or sputtering.

(Emission Mechanism of Light-Emitting Element 7)

Next, the emission mechanism of the phosphor irradiated with the laser light emitted from the semiconductor lasers 3 will be described.

When the phosphor contained in the light-emitting element 7 is irradiated with the laser light emitted from the semiconductor lasers 3, electrons present in the phosphor are excited from a low-energy state to a high-energy state (excited state).

Because the excited state is unstable, the electrons in the phosphor transition to the initial low-energy state (the energy state at the ground level or a metastable level between the excited level and the ground level) after a predetermined period of time elapses.

When the electrons excited to the high-energy state transition to the low-energy state, they emit fluorescence.

White light can be produced, for example, by mixing three colors based on the principle of metamerism or by mixing two complementary colors. Based on this principle or relationship, the color of laser light emitted from semiconductor lasers and the color of light emitted from phosphors can be combined as described above to produce white light.

(Method for Manufacturing Headlamp 1)

Next, a method for manufacturing the headlamp 1 will be described with reference to FIG. 4. The steps of the method for manufacturing the headlamp 1 other than a step of forming the gap layer 15 will be described later.

Figure 4:
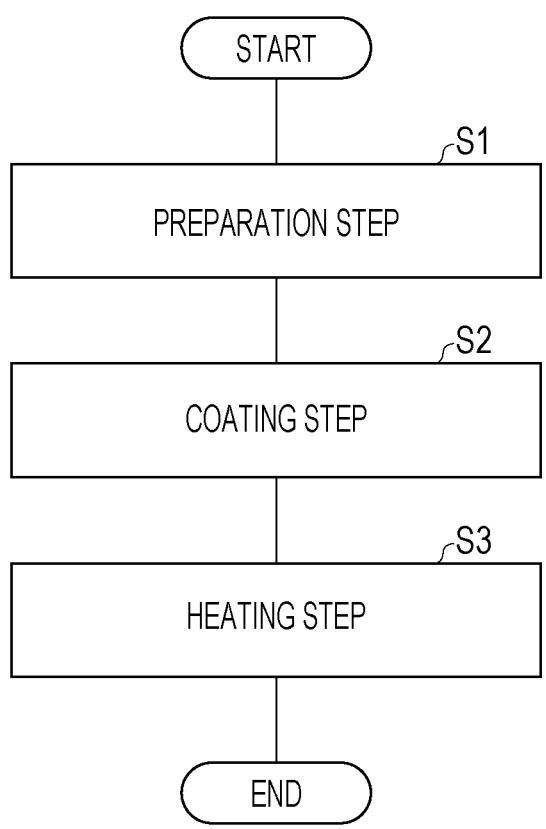
FIG. 4 is a flowchart showing the flow of a gap-layer forming step of forming the gap layer shown in FIG. 2.
Figure 5:
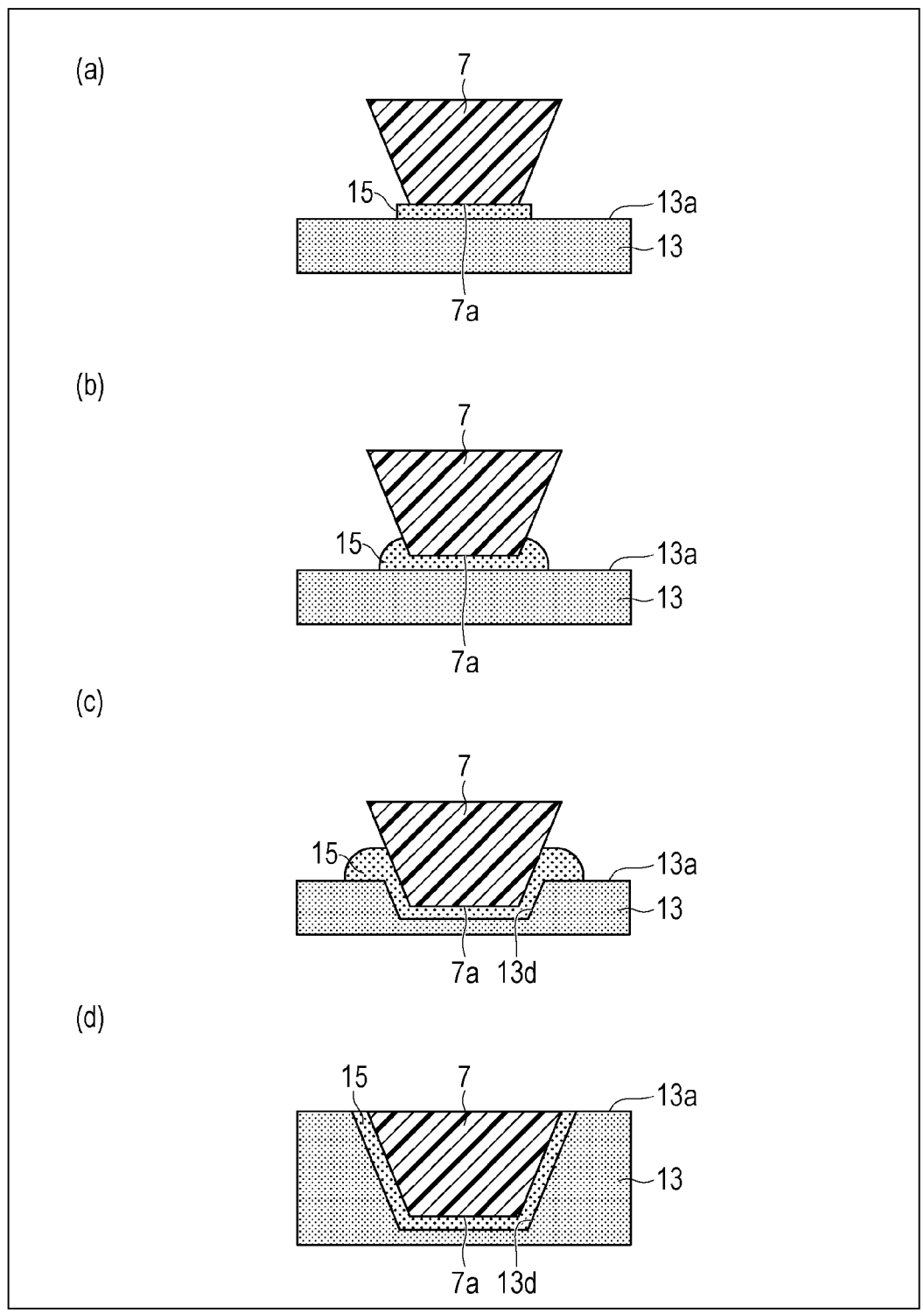
FIGS. 5($a$) to 5($d$) are sectional views showing modifications of the structure in which the light-emitting element and the heat-conducting member are bonded with the gap layer in FIG. 2.

FIG. 4 is a flowchart showing the flow of the gap-layer forming step of forming the gap layer 15. As shown in FIG. 4, the gap-layer forming step includes preparation step S1, coating step S2, and heating step S3.

(Preparation Step S1)

Preparation step S1 is a step of preparing a paste-like adhesive containing fine particles (powder) of an inorganic amorphous material. This embodiment illustrates a method for preparing a glass paste adhesive containing inorganic glass fine particles as an inorganic amorphous material.

The glass paste adhesive can be prepared, for example, by dispersing inorganic glass fine particles (for example, having a particle size of about 1 μm and a refractive index of 1.76) in an organic binder.

Because the glass paste adhesive is a dispersion in the organic binder, fine irregularities in the surface of the light-emitting element 7 and the light-emitting-element facing surface 13a can be filled with the inorganic glass fine particles or the organic binder by applying the glass paste adhesive. This improves the thermal conductivity at the interface between the light-emitting element 7 and the gap layer 15. The gap layer 15 can therefore more efficiently conduct the heat generated by the light-emitting element 7 to the heat-conducting member 13.

(Coating Step S2)

Coating step S2 is a step of applying the glass paste adhesive prepared in preparation step S1 to the light-emitting-element facing surface 13a of the heat-conducting member 13.

The glass paste adhesive may be applied in various manners. Preferably, the glass paste adhesive is applied by screen printing.

If the glass paste adhesive is applied by screen printing, the thickness of the glass paste adhesive can be precisely controlled. This allows a thin gap layer 15 with uniform thickness to be precisely formed.

Thus, the glass paste adhesive can be applied in a thin layer to form a gap layer 15 having low thermal resistance. The gap layer 15 can therefore efficiently conduct the heat generated by the light-emitting element 7 to the heat-conducting member 13.

The glass paste adhesive may be applied to at least one of the light-emitting element 7 and the light-emitting-element facing surface 13a.

(Heating Step S3)

Heating step S3 is a step of bringing the light-emitting element 7 into contact with the glass paste adhesive applied in coating step S2 and heating it to form the gap layer 15. As a result, the heat-conducting member 13 and the light-emitting element 7 can be bonded with the gap layer 15.

In heating step S3, the organic binder evaporates or decomposes during heating (at about 200° C. to 700° C.). The content of the residual organic binder in the resulting gap layer 15 can be controlled by controlling the heating time or heating temperature.

Thus, the gap-layer forming step allows a thin gap layer 15 with uniform thickness to be precisely formed.

(Advantages of Headlamp 1)

As described above, the headlamp 1 according to this embodiment includes the semiconductor lasers 3 that emit laser light, the light-emitting element 7 that emits light in response to the laser light emitted from the semiconductor lasers 3, the heat-conducting member 13 that has the light-emitting-element facing surface 13a facing the light-emitting element 7 and that receives heat generated by the light-emitting element 7 through the light-emitting-element facing surface 13a, and the gap layer 15 that is disposed between the light-emitting element 7 and the light-emitting-element facing surface 13a and that conducts the heat generated by the light-emitting element 7 to the light-emitting-element facing surface 13a. The gap layer 15 contains an inorganic amorphous material.

Because the gap layer 15 is formed of the inorganic amorphous material, the thermal resistance of the gap layer 15 is about one tenth that of, for example, a gap layer 15 formed of an organic material such as resin. The gap layer 15 can therefore conduct the heat generated by the light-emitting element 7 to the heat-conducting member 13 without limiting the rate thereof.

Thus, the heat generated by the light-emitting element 7 can be efficiently dissipated, and a decrease in the luminous efficiency of the phosphor contained in the light-emitting element 7 can also prevented, thereby reducing degradation of the light-emitting element 7.

Thus, this embodiment provides a headlamp 1 that can efficiently dissipate the heat generated by the light-emitting element 7.

(Modifications of Bonding Structure Using Gap Layer 15)

FIGS. 5(a) to 5(d) are sectional views showing modifications of the structure in which the light-emitting element 7 and the heat-conducting member 13 are bonded with the gap layer 15 in FIG. 2. As shown in FIGS. 5(a) to 5(d), the light-emitting element 7 may be frusto-conical or frusto-pyramidal. FIGS. 5(a) to 5(d) illustrate structures in which the light-emitting element 7 is fixed to the light-emitting-element facing surface 13a with the gap layer 15 such that the narrower one of the two opposing flat surfaces of the light-emitting element 7 faces the light-emitting-element facing surface 13a. The narrower surface is the laser-light irradiation surface 7a.

In this case, as shown in FIG. 5(a), the gap layer 15 may be in contact with only the laser-light irradiation surface 7a of the light-emitting element 7. This structure is less advantageous in terms of the effect of heat dissipation from the light-emitting element 7 than the structures shown in FIGS. 5(b) to 5(d), described below, but is most advantageous in terms of the efficiency of light output from the light-emitting element 7.

As shown in FIG. 5(b), the gap layer 15 may be in contact with the laser-light irradiation surface 7a and the side surfaces of the light-emitting element 7 around the laser-light irradiation surface 7a. This structure has a larger contact area between the light-emitting element 7 and the gap layer 15 and a larger contact area between the gap layer 15 and the heat-conducting member 13 than the structure shown in FIG. 5(a), thus improving the effect of heat dissipation from the light-emitting element 7.

As shown in FIG. 5(c), the light-emitting element 7 may be partially embedded in a recess 13d formed in the heat-conducting member 13 such that the gap layer 15 is in contact with the laser-light irradiation surface 7a and the side surfaces of the light-emitting element 7 around the laser-light irradiation surface 7a. This structure has a larger contact area between the gap layer 15 and the heat-conducting member 13 than the structure shown in FIG. 5(b), thus further improving the effect of heat dissipation from the light-emitting element 7.

As shown in FIG. 5(d), the entire light-emitting element 7 may be embedded in the recess 13d formed in the heat-conducting member 13 such that the gap layer 15 is in contact with the laser-light irradiation surface 7a and the entire side surfaces of the light-emitting element 7. This structure has a larger contact area between the light-emitting element 7 and the gap layer 15 and a larger contact area between the gap layer 15 and the heat-conducting member 13 than the structures shown in FIGS. 5(a) to 5(c). This structure is therefore most advantageous in terms of the effect of heat dissipation from the light-emitting element 7.

Second Embodiment

Another embodiment of the present invention will now be described with reference to FIG. 6. The same components as in the first embodiment are indicated by the same reference signs, and a description thereof is omitted. This embodiment illustrates another example of the member that holds the light-emitting element 7 together with the heat-conducting member 13.

(Structure of Headlamp 30)

Figure 6:
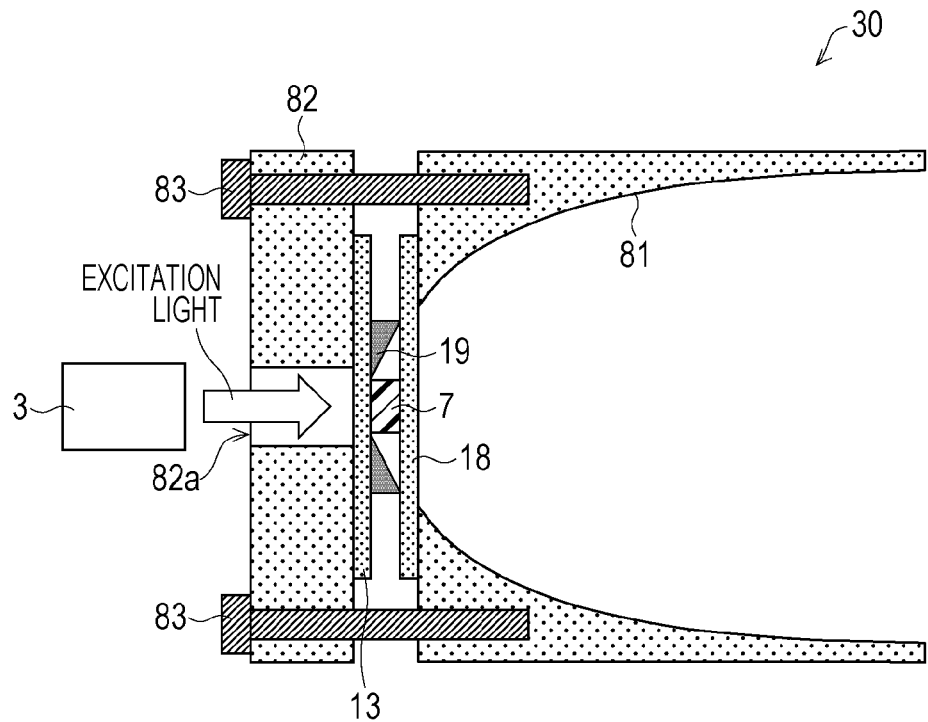
FIG. 6 is a sectional view showing the structure of a headlamp according to a second embodiment.

FIG. 6 is a sectional view showing the structure of a headlamp 30 according to this embodiment. As shown in FIG. 6, the headlamp 30 includes a transparent plate 18, a metallic ring 19, a reflective mirror 81, a substrate 82, and screws 83. The light-emitting element 7 of the headlamp 30 is held between the heat-conducting member 13 and the transparent plate 18.

The reflective mirror 81 has the same function as the reflective mirror 8 and is shaped to be cut in a plane perpendicular to the optical axis near the focal position thereof. The reflective mirror 81 may be formed of any material, although it is preferred in terms of reflectance to use a reflective mirror formed of copper or stainless steel (SUS) and coated with, for example, silver or chromate. Alternatively, the reflective mirror 81 may be a reflective mirror formed of aluminum on which an oxidation-resistant film is formed or may be a reflective mirror formed of resin on which a thin metal film is formed.

The metallic ring 19 is a mortar-shaped ring having the shape of the portion of the reflective mirror 81 near the focal position thereof if the reflective mirror 81 were a complete reflective mirror and has an opening in the bottom of the mortar shape. The light-emitting element 7 is disposed in the bottom opening.

The mortar-shaped surface of the metallic ring 19 functions as a reflective mirror and is combined with the reflective mirror 81 to form a reflective mirror having a complete shape. Thus, the metallic ring 19 is a partial reflective mirror functioning as a portion of the reflective mirror. If the reflective mirror 81 is referred to as a first partial reflective mirror, the metallic ring 19 can be referred to as a second partial reflective mirror that forms the portion of the reflective mirror near the focal position thereof. The fluorescence emitted from the light-emitting element 7 is partially reflected by the surface of the metallic ring 19 and is output forward of the headlamp 30 as illumination light.

The metallic ring 19 may be formed of any material, although materials such as silver, copper, and aluminum are preferred in terms of heat dissipation. If the metallic ring 19 is formed of silver or aluminum, the mortar-shaped portion thereof is preferably mirror-finished and is then coated with a protective layer (such as chromate coating or resin layer) for preventing darkening and oxidation. If the metallic ring 19 is formed of copper, it is preferably plated with silver or metallized with aluminum and is then coated with the protective layer.

The light-emitting element 7 is bonded to the heat-conducting member 13 with the gap layer 15 (not shown in FIG. 6), and the metallic ring 19 is also in contact with the heat-conducting member 13. The metallic ring 19 in contact with the heat-conducting member 13 provides the effect of cooling the heat-conducting member 13. That is, the metallic ring 19 also functions as a cooling element for the heat-conducting member 13.

The transparent plate 18 is held between the metallic ring 19 and the reflective mirror 81. The transparent plate 18 is in contact with the surface of the light-emitting element 7 opposite the laser-light irradiation surface 7a thereof and functions to press the light-emitting element 7 against the heat-conducting member 13 so that the light-emitting element 7 dose not come off the heat-conducting member 13. The mortar-shaped portion of the metallic ring 19 has a depth substantially equal to the height of the light-emitting element 7. Thus, the transparent plate 18 is in contact with the light-emitting element 7 with a predetermined distance maintained between the transparent plate 18 and the heat-conducting member 13. This prevents the light-emitting element 7 from being crushed between the heat-conducting member 13 and the transparent plate 18.

The transparent plate 18 may be formed of any material that is at least light-transmissive. If the light-emitting element 7 is in contact with the transparent plate 18, or if the heat-conducting member 13 is in contact with the transparent plate 18, the transparent plate 18, like the heat-conducting member 13, is preferably formed of a material having high thermal conductivity (20 W/mK or more). For example, the transparent plate 18 preferably contains sapphire, gallium nitride, magnesia, or diamond. In this case, the transparent plate 18 has a higher thermal conductivity than the light-emitting element 7 and can therefore efficiently absorb and dissipate the heat generated by the light-emitting element 7.

The heat-conducting member 13 and the transparent plate 18 preferably have a thickness of about 0.3 to 5.0 mm. If the heat-conducting member 13 and the transparent plate 18 have a thickness of below 0.3 mm, they have an insufficient strength to hold and fix the light-emitting element 7 and the metallic ring 19. If the heat-conducting member 13 and the transparent plate 18 have a thickness of above 5.0 mm, they absorb a considerable amount of laser light and also increase the component cost.

The substrate 82 is a plate-shaped member having an opening 82a through which the laser light emitted from the semiconductor lasers 3 passes. The reflective mirror 81 is fixed to the substrate 82 with the screws 83. The heat-conducting member 13, the metallic ring 19, and the transparent plate 18 are disposed between the reflective mirror 81 and the substrate 82. The center of the opening 82a is substantially aligned with the center of the bottom opening of the metallic ring 19. Thus, the laser light emitted from the semiconductor lasers 3 passes through the opening 82a of the substrate 82, the heat-conducting member 13, and the opening of the metallic ring 19 to reach the light-emitting element 7.

The substrate 82 may be formed of any material, although the use of a metal with high thermal conductivity allows the substrate 82 to function as a heat-dissipating element that dissipates the heat conducted to the heat-conducting member 13. Because an entire surface of the heat-conducting member 13 is in contact with the substrate 82, the use of a metal such as iron or copper for the substrate 82 improves the effect of heat dissipation from the heat-conducting member 13 and therefore from the light-emitting element 7.

The substrate 82 is not necessarily configured as described above. For example, the substrate 82 may have a cooling system to improve the heat dissipation effect of the substrate 82. An example of such a cooling system is a water-cooling system that circulates water. In this case, the substrate 82 may have a passage through which cooling water flows for circulation of water and may be thermally connected to a water-cooling system unit. The cooling system is not necessarily a water-cooling system using water, but may be a cooling system using a liquid other than water, or a gas, as an alternative to water.

The metallic ring 19 is preferably securely fixed to the heat-conducting member 13. The metallic ring 19 can be rather firmly fixed to the heat-conducting member 13 under the pressure exerted by fixing the substrate 82 and the reflective mirror 81 with the screws 83. However, if the metallic ring 19 is securely fixed by a method such as bonding the metallic ring 19 to the heat-conducting member 13 with an adhesive or screwing the metallic ring 19 to the substrate 82 with the heat-conducting member 13 therebetween, the risk of the light-emitting element 7 coming off upon displacement of the metallic ring 19 can be avoided.

The metallic ring 19 may be any ring that functions as a partial reflective mirror, as described above, and that can withstand the pressure exerted by fixing the substrate 82 to the reflective mirror 81 with the screws 83, and need not necessarily be formed of a metal. For example, the metallic ring 19 may be replaced by a resin ring that can withstand the above pressure and on which a thin metal film is formed.

(Advantages of Headlamp 30)

In the headlamp 30, the light-emitting element 7 is held between the heat-conducting member 13 and the transparent plate 18 to fix the positions of the light-emitting element 7 and the heat-conducting member 13 relative to each other. This prevents the light-emitting element 7 from coming off the heat-conducting member 13 if the gap layer 15 has low adhesion or if the light-emitting element 7 and the heat-conducting member 13 differ in thermal expansion coefficient.

Third Embodiment

Another embodiment of the present invention will now be described with reference to FIGS. 7 to 11. The same components as in the first embodiment are indicated by the same reference signs, and a description thereof is omitted.

This embodiment illustrates an automotive headlamp (vehicle headlamp) 60 including a light-emitting element 17 having a composition with superior heat dissipation. In the following description, a structure of the automotive headlamp 60 in which no gap layer 15 according to the present invention is formed will be discussed first.

(Structure of Headlamp 60)

Figure 8:
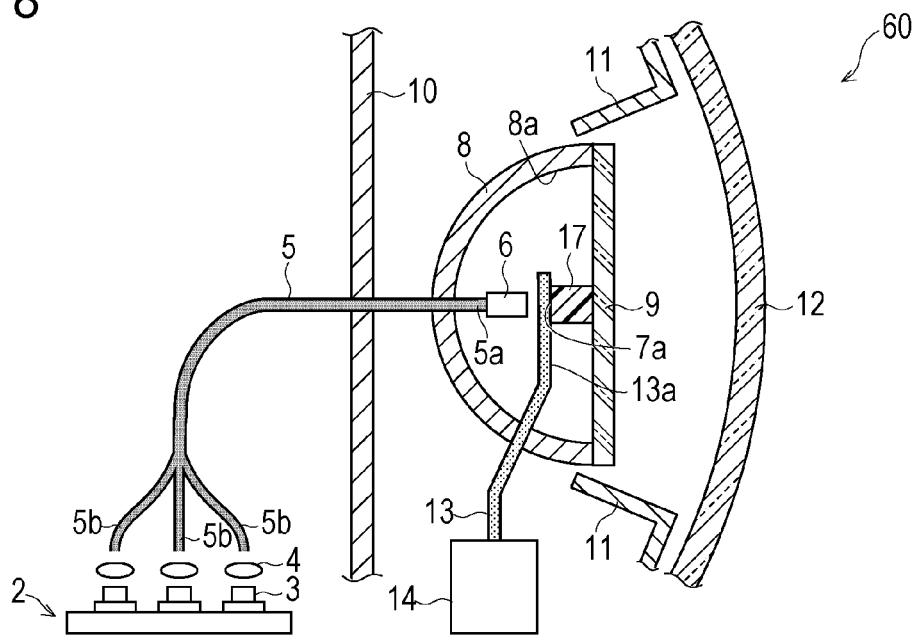
FIG. 8 is a sectional view showing the structure of the headlamp including the light-emitting element and the heat-conducting member shown in FIG. 7.

FIG. 8 is a sectional view showing the structure of the headlamp 60. As shown in FIG. 8, the headlamp 60 includes a semiconductor laser array 2, aspherical lenses 4, optical fibers 5, a ferrule 6, a light-emitting element (sintered light emitter) 17, a reflective mirror 8, a transparent plate 9, a housing 10, an extension 11, a lens 12, a heat-conducting member 13, and a cooling element 14.

(Light-Emitting Element 17)
(Composition of Light-Emitting Element 17)

FIG. 7 is an illustration showing the details of the light-emitting element (light emitter, sintered light emitter) 17 and the heat-conducting member 13. The light-emitting element 17 emits light in response to the laser light output from the output ends 5a. The light-emitting element 17 is formed by mixing, injection molding, and sintering of a ceramic material, a binder, and phosphor particles 16. The phosphor particles 16 are uniformly dispersed in the light-emitting element 17.

The light-emitting element 17 contains one or more of phosphors that emit blue light, green light, and red light. Because the semiconductor lasers 3 emit laser light at 405 nm (blue-violet), the light-emitting element 17, when irradiated with the laser light, emits white light as a result of mixing of different colors. The light-emitting element 17 thus functions as a wavelength-converting material.

(Binder)

The binder is mixed with the ceramic material and the phosphor particles 16, and the mixture is sintered to bond the ceramic material and the phosphor particles 16. The binder may be formed of any material, although it is important to select a material that decomposes at relatively low temperatures and that leaves no residue such as ash after decomposition. For example, the binder may be acrylic resin, epoxy resin, or silicone resin. By sintering the ceramic material and the phosphor particles 16 with the binder, grain boundaries can be formed in the light-emitting element 17, as described in detail later.

(Ceramic Material)

The ceramic material forming the light-emitting element 17 preferably has high thermal conductivity and is light-transmissive.

One of the ceramic materials that meet the above conditions is alumina. Alumina is suitable for forming the light-emitting element 17 because it has a density of 3.8 to 3.9 g/cm$^3$ and a thermal conductivity of 15 to 40 W/mK, is available at low cost, and is reliable with high acid and alkali resistance.

Examples of other ceramic materials include aluminum nitride, magnesia, silicon nitride, and silicon carbide. Aluminum nitride has a density of 3.2 to 3.3 g/cm$^3$ and a thermal conductivity of 80 to 250 W/mK. Magnesia has a density of 3.5 g/cm$^3$ and a thermal conductivity of 48 W/mK. Silicon nitride has a density of 3.0 to 3.2 g/cm$^3$ and a thermal conductivity of 20 to 90 W/mK. Silicon carbide has a density of 3.0 to 3.2 g/cm$^3$ and a thermal conductivity of 60 to 180 W/mK. Thus, various ceramic materials can be used instead of alumina, described above.

(Modification of Light-Emitting Element 17)

Figure 9:
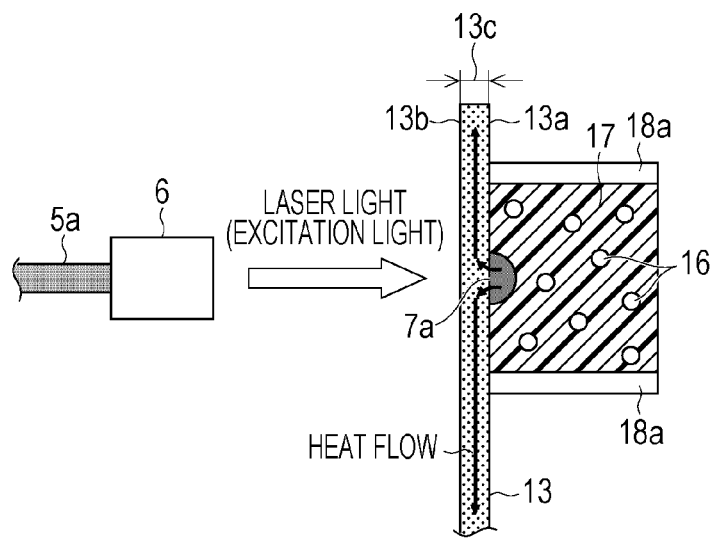
FIG. 9 is a sectional view showing a modification of the light-emitting element shown in FIG. 7.

FIG. 9 is a sectional view showing a modification of the light-emitting element 17 shown in FIG. 7. As shown in FIG. 9, heat-conducting walls (heat-conducting members) 18a may be formed in contact with the side surfaces of the light-emitting element 17. The heat-conducting walls 18a are formed of, for example, a metal (such as aluminum) or a light-transmissive material with high thermal conductivity, such as sapphire or an inorganic glass.

The heat-conducting walls 18a, provided as second heat-conducting members in addition to the heat-conducting member 13, can improve the effect of heat dissipation from the light-emitting element 17.

(Method for Fabricating Light-Emitting Element 17)

Next, a method for fabricating the light-emitting element 17 will be described.

The ceramic material, the phosphor powder, and the binder are weighed and uniformly mixed in a predetermined ratio (mixing step). This mixing process may be performed by manually shaking a container containing the weighed powders or using a mixing apparatus.

The mixing ratio of the ceramic material and the phosphor powder to the binder is preferably 50:50 to 70:30. The concentration of the phosphor in the ceramic is preferably about 1:10 to 1:2, depending on the target color temperature and chromaticity and the efficiency and particle size of the phosphor used. The mixing ratio, however, is not necessarily within the above range, but may be set to any suitable ratio.

Figure 10:
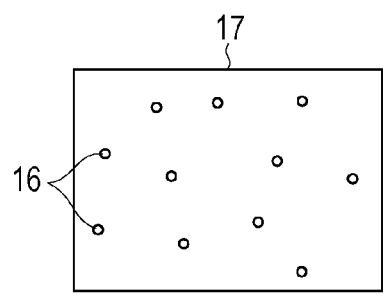
FIG. 10 is a conceptual diagram showing phosphor particles dispersed in the light-emitting element.

FIG. 10 is a conceptual diagram showing the phosphor particles 16 dispersed in the light-emitting element 17. If the light-emitting element 17 has high phosphor concentration, the phosphor particles 16 are preferably uniformly dispersed in the sealing material, as shown in FIG. 10. If the phosphor particles 16 are concentrated at one site, considerable heat is generated at that site and might therefore decrease the luminous efficiency and degrade the light-emitting element 17.

If the ceramic material is to be sintered together with the phosphor, the ceramic material is preferably powder particles with the highest possible purity and a particle size of 0.5 to 2 μm.

After the mixing step, the mixed powder is injection-molded into the desired shape (molding step). Injection molding allows a molded product to be transferred as injected to the next sintering step and is therefore particularly effective in dispersing the phosphor in the molded product.

The molding step is followed by a debindering step. This step involves heating the molded product to a temperature of about 400° C. to 600° C. to decompose and evaporate the binder, for example, through a depolymerization reaction. The molded product is then sintered (sintering step). This step involves sintering the molded product to form grain boundaries (interfaces between crystal grains or particles) in the sintered product. These grain boundaries provide the following advantage. Specifically, if the excitation light is laser light, which contains a coherent component and is therefore likely to damage the human eyes, the laser light is scattered by the grain boundaries. This magnifies the light-emitting point, thus improving the safety of the light-emitting apparatus.

The sintering temperature in the sintering step is preferably about 0.6 to 0.8 time the melting point of the ceramic material, typically about 800° C. to 1,500° C. The sintering temperature can be lowered if a sintering aid is used. The sintering step may be performed, for example, at 1,200° C. for 2 hours after the debindering step is performed at 500° C. for 3 hours. The sintering time is not necessarily set to the period of time illustrated above, but may be changed.

The grain boundaries need to be sized to scatter light. For example, the grain boundaries may be sized to cause Rayleigh scattering (grain boundary size of one to several tens of nanometers), which occurs to different extents depending on the wavelength, or to cause Mie scattering or diffraction scattering (grain boundary size similar to the wavelength of visible light, i.e., several hundreds of nanometers to about 50 μm), which occurs irrespective of the wavelength.

The light-emitting element 17 may also be fabricated by a melting process, rather than by the molding and sintering steps. In this case, however, a problem arises in that the phosphor is not uniformly dispersed in the light-emitting element 17. In addition, the melting process does not form grain boundaries, which would be formed in the sintering step, and therefore does not provide the effect of dispersing the laser light to improve the safety of the headlamp 60.

For this reason, the light-emitting element 17 is preferably fabricated by the mixing, molding, and sintering steps described above. The light-emitting element 17, however, is not necessarily fabricated by the mixing, molding, and sintering steps, but may be fabricated by other methods that allow the phosphor to be uniformly dispersed in the light-emitting element 17 and that form grain boundaries in the light-emitting element 17.

(Example of Method for Fabricating Light-Emitting Element 17)

An example of a method for fabricating the light-emitting element 17 will now be described.

As described above, if the ceramic material is to be sintered together with the phosphor, the ceramic material is preferably powder particles with the highest possible purity and a particle size of 0.5 to 2 μm. For example, if the ceramic material is alumina, it preferably has a particle size of 0.1 to 0.5 μm. The fine aluminum particles are uniformly mixed with a YAG:Ce$^{3+}$ phosphor, a binder, and a sintering aid and are pelletized in the mixing step. The fine aluminum particles, the YAG:Ce$^{3+}$, and the binder are mixed in a ratio of 4:1:5. An extremely small amount of sintering aid may also be added.

The mixed powder prepared in the mixing step is subjected to the molding step and the sintering step to form the desired light-emitting element 17. In this example, the sintering step is performed by debindering the molded product formed in the molding step by heating under reduced pressure and then sintering the molded product in N$_2$ gas.

Debindering by heating under reduced pressure and sintering in N$_2$ gas need not necessarily be performed. However, if the phosphor material is YAG:Ce$^{3+}$, Ce$^{3+}$ changes to Ce$^{2+}$ when the molded product is heated in an oxygen-containing atmosphere. This causes a problem in that the molded product is colored and exhibits decreased luminous efficiency. Thus, depending on the conditions such as the type of phosphor material, debindering by heating under reduced pressure, sintering in N$_2$ gas, and other optional steps may be added to fabricate a preferred sintered light emitter.

Examples of suitable phosphor materials other than YAG:Ce$^{3+}$ include oxynitride phosphors and nitride phosphors. If the excitation light source is a 405 nm semiconductor laser, JEM, which is a blue phosphor, β-SiAlON:Eu$^{2+}$, which is a green phosphor, and CASN:Eu$^{2+}$, which is a red phosphor, may be used. The use of SCASN:Eu$^{2+}$, which contains strontium (Sr), as a red phosphor instead of CASN:Eu$^{2+}$ improves the luminous efficiency, although color rendering is slightly sacrificed. If the excitation light source is a semiconductor laser that emits light around 450 nm, β-SiAlON:Eu$^{2+}$ may be used in combination with CASN:Eu$^{2+}$ or SCASN:Eu$^{2+}$ as a red phosphor.

(Advantages of Headlamp 60)

The inventors have found that excitation with high-power laser light considerably degrades the light-emitting element 17. The degradation of the light-emitting element is 17 primarily due to degradation of the phosphor itself contained in the light-emitting element 17 and degradation of the sealing material surrounding the phosphor. For example, the above SiAlON phosphor emits light with an efficiency of 60% to 80% when irradiated with laser light and releases the remainder as heat.

The light-emitting element 17 of the headlamp 60 is fabricated by sintering a ceramic material such as alumina and a phosphor that emits light in response to the laser light emitted from the semiconductor lasers 3 with a binder. The light-emitting element 17 therefore has high thermal conductivity, which allows heat to be efficiently conducted from the light-emitting element 17 to the heat-conducting member 13 and thus to be effectively dissipated from the light-emitting element 17. This prevents thermal degradation and decreased luminous efficiency of the light-emitting element 17.

Thus, the headlamp 60 has an extended life and high reliability as an ultrahigh-intensity light source using laser light as excitation light.

(Comparison of Headlamp 60 with Conventional Light-Emitting Apparatus)

Next, the advantages provided by the headlamp 60 will be described with reference to Tables 1 and 2.

[Table 1: Material of Light-Emitting Element]

TABLE 1

| Component | Sealing material | Ceramic material |
| --- | --- | --- |
| Material | Inorganic glass | Alumina |
| Thermal conductivity (W/mK) | 1.0 | 20.0 |
| Particle size (μm) | — | — |

TABLE 1-continued

| Component | Sealing material | Ceramic material |
| --- | --- | --- |
| Thickness | 0.2-2.0 mm | 0.2-2.0 mm |
| Heat resistance (° C.) | <500 | <500 |
| Transmittance (%) (including surface reflection) | 87.3 (wavelength: 600 nm, 1 mm thick) | 87.3 (wavelength: 600 nm, 1 mm thick) |

The advantages of the headlamp 60 will be discussed by comparing a headlamp 60 including a light-emitting element containing aluminum as a ceramic material with a conventional light-emitting apparatus including a light-emitting element containing an inorganic glass as a sealing material, as shown in Table 1.

As shown in Table 1, the inorganic glass has a thermal conductivity of 1 W/mK, and alumina has a thermal conductivity of 20 W/mK. The light-emitting elements are discs in which oxynitride phosphors (Caα-SiAlON:Ce and CASN:Eu) are dispersed and having a diameter of 3 mm and a thickness of 1.5 mm.

Among typical sealing materials for sealing a phosphor are silicone resins and organic-inorganic hybrid glasses, which have thermal conductivities of about 0.1 to 0.2 W/mK, and inorganic glasses, which have thermal conductivities of about 1 to 2 W/mK. For example, if an exothermic element having a thermal conductivity of 0.2 W/mK and a size of 3 mm×3 mm×1 mm in thickness generates heat at 1 W from a 3 mm×3 mm surface thereof while being thermally insulated from the outside, the temperature of the exothermic element is calculated to be higher than 500° C. (555.6° C.) by thermal simulations.

If a sealing material having a thermal conductivity of 2 W/mK is used, the temperature of the exothermic element rises by 55.6° C. for the same size and the same amount of heat generated. Thus, the thermal conductivity of the sealing material is of great significance. If the sealing material has a thermal conductivity of 2 W/mK and the exothermic element has a size of 3 mm×1 mm×1 mm in thickness, the temperature of the exothermic element rises by 166.7° C. Thus, as the size of the light-emitting element 17 is decreased for increased intensity, the temperature of the light-emitting element 17 becomes higher for the same amount of heat generated, and the load on the light-emitting element 17 becomes larger accordingly.

In view of the foregoing, the advantages of the headlamp 60 will be discussed by comparing an inorganic glass used for conventional light-emitting elements with alumina, which has a thermal conductivity of 20 W/mK.

The thermal resistances of the inorganic glass and alumina are first calculated from the above table. The thermal resistance of each component can be calculated by equation (1) below.

$$\text{Thermal resistance} = (1/\text{thermal conductivity}) \times (\text{heat dissipation path length}/\text{heat dissipation cross-sectional area}) \quad (1)$$

The heat dissipation path length corresponds to the thickness of each component (the thickness in the direction in which the laser light passes through the component), and the heat dissipation cross-sectional area corresponds to the contact area between the components. Table 2 shows a specific example of a thermal resistance calculation.

[Table 2: Example of Thermal Resistance Calculation]

TABLE 2

| Component | Sealing material of light-emitting element | Ceramic material |
|---|---|---|
| Material | Inorganic glass | Alumina |
| Thermal conductivity (W/mK) | 1.0 | 20.0 |
| Heat dissipation area (m$^2$) | $3 \times 10^{-6}$ | $3 \times 10^{-6}$ |
| Heat dissipation distance (m) | $2.5 \times 10^{-4}$ | $2.5 \times 10^{-4}$ |
| Thermal resistance (K/W) | 83.3 | 4.2 |

As shown in Table 2, the inorganic glass and alumina are compared. The light-emitting element containing the inorganic glass has a thermal resistance of 83.3 K/W, whereas the light-emitting element containing alumina has a thermal resistance of 4.2 K/W. That is, for heat generation at 1 W, the temperature of the light-emitting element containing the inorganic glass is assumed to rise by 83.3° C., whereas the temperature of the light-emitting element containing alumina is assumed to rise only by 4.2° C. Thus, the use of alumina, which has a thermal resistance of 20 W/mK, drastically reduces the thermal resistance of the light-emitting element. This demonstrates that improving the thermal conductivity of the material forming the light-emitting element is extremely effective in reducing the temperature rise of the light-emitting element.

For the above reason, the light-emitting element 17 of the headlamp 60 has high thermal conductivity, which allows heat to be efficiently conducted from the light-emitting element 17 to the heat-conducting member 13 and thus to be effectively dissipated from the light-emitting element 17. This prevents thermal degradation and decreased luminous efficiency of the light-emitting element 17.

Figure 11:
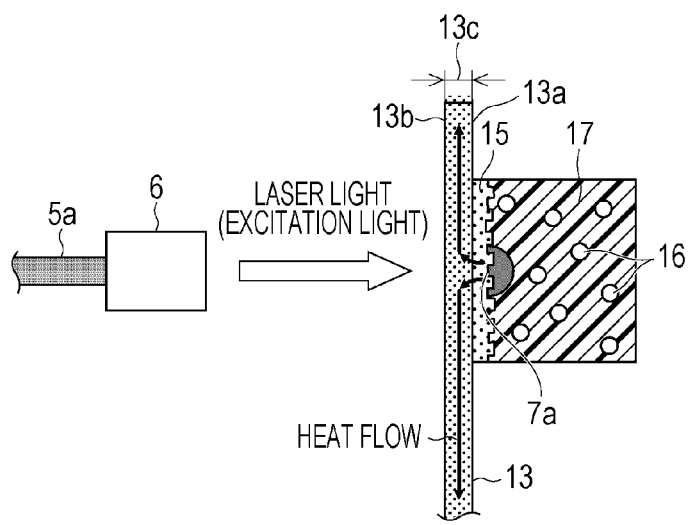
FIG. 11 is an illustration showing a structure in which the light-emitting element and the heat-conducting member are bonded with the gap layer in the headlamp shown in FIG. 7.

FIG. 11 is an illustration showing a structure in which the light-emitting element 17 and the heat-conducting member 13 are bonded with the gap layer 15 in the headlamp 60 shown in FIG. 7. As described above, the light-emitting element 17 of the headlamp 60 is fabricated by sintering a ceramic material and a phosphor with a binder. The light-emitting element 17 therefore has high thermal conductivity, which allows heat to be efficiently conducted from the light-emitting element 17 to the heat-conducting member 13 and thus to be effectively dissipated from the light-emitting element 17. This prevents thermal degradation and decreased luminous efficiency of the light-emitting element 17 in the headlamp 60.

In the headlamp 60, as shown in FIG. 11, the light-emitting element 17 and the heat-conducting member 13 are bonded with the gap layer 15, which contains an inorganic amorphous material, rather than with a conventional organic resin adhesive. The gap layer 15 can conduct the heat generated by the light-emitting element 17 to the heat-conducting member 13 without limiting the rate thereof.

Thus, the heat generated by the light-emitting element 17 can be more efficiently conducted to the heat-conducting member 13. This further improves the effect of heat dissipation from the light-emitting element 17 of the headlamp 60.

Fourth Embodiment

Another embodiment of the present invention will now be described with reference to FIGS. 12 to 20. The same components as in the above embodiments are indicated by the same reference signs, and a description thereof is omitted.

This embodiment illustrates a laser downlight 200 as an example of an illumination system according to the present invention. The laser downlight 200 is an illumination system installed in a ceiling of a structure such as a house or vehicle and uses as illumination light fluorescence emitted from a light-emitting element 7 when the light-emitting element 7 is irradiated with laser light emitted from a semiconductor laser 3.

An illumination system having the same structure as the laser downlight 200 may be installed in any place, such as a sidewall or floor of a structure.

Figure 12:
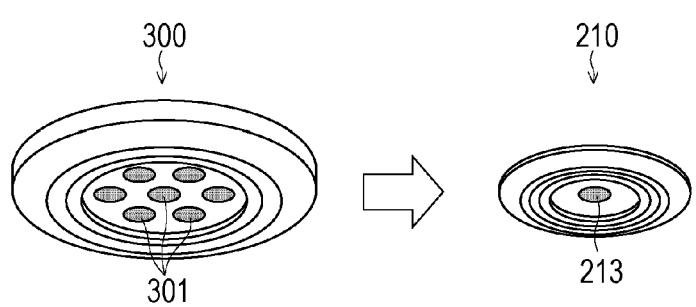
FIG. 12 is a perspective view showing the appearance of a light-emitting unit of a laser downlight according to a fourth embodiment and a conventional LED downlight.
Figure 13:
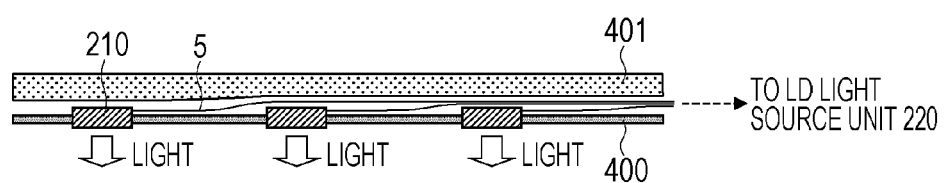
FIG. 13 is a sectional view of a ceiling in which the laser downlight shown in FIG. 12 is installed.

FIG. 12 is a perspective view showing the appearance of a light-emitting unit 210 and a conventional LED downlight 300. FIG. 13 is a sectional view of a ceiling in which the laser downlight 200 is installed, and FIG. 14 is a sectional view of the laser downlight 200.

Figure 14:
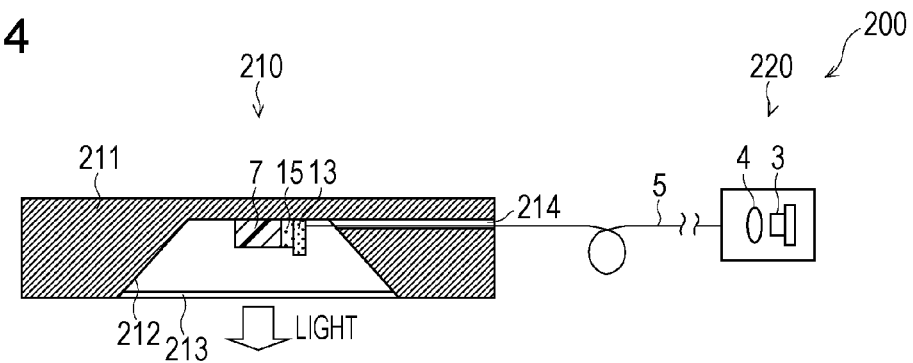
FIG. 14 is a sectional view of the laser downlight according to the fourth embodiment.

As shown in FIGS. 12 to 14, the laser downlight 200 includes light-emitting units 210 that are embedded in a top plate 400 and that emit illumination light and an LD light source unit 220 that supplies laser light through optical fibers 5 to the light-emitting units 210. The LD light source unit 220 is not installed in the ceiling, but is installed at a position easily accessible to the user (for example, a sidewall of a house). The LD light source unit 220 can thus be installed at any position because the LD light source unit 220 and the light-emitting units 210 are connected with the optical fibers 5. The optical fibers 5 are disposed in the gap between the top plate 400 and a heat-insulating material 401.

(Structure of Light-Emitting Units 210)

As shown in FIG. 14, the light-emitting units 210 include a casing 211, an optical fiber 5, a light-emitting element 7, a heat-conducting member 13, and a light-transmissive plate 213. The light-emitting element 7 is bonded to the heat-conducting member 13 with a gap layer 15. As in the above embodiments, the heat generated by the light-emitting element 7 is conducted to the heat-conducting member 13 and is thereby efficiently dissipated.

The casing 211 has a recess 212, and the light-emitting element 7 is disposed on the bottom of the recess 212. A thin metal film is formed on the surface of the recess 212 so that the recess 212 functions as a reflective mirror.

The casing 211 also has a passage 214 through which the optical fiber 5 passes. The optical fiber 5 extends through the passage 214 to the heat-conducting member 13. The laser light output from the output end 5a of the optical fiber 5 passes through the heat-conducting member 13 and the gap layer 15 to reach the light-emitting element 7.

The light-transmissive plate 213 is a transparent or translucent plate covering the opening of the recess 212. The light-transmissive plate 213 has a similar function to the transparent plate 9, and the fluorescence emitted from the light-emitting element 7 is output through the light-transmissive plate 213 as illumination light. The light-transmissive plate 213 may be detachable from the casing 211 or may be omitted.

Although the light-emitting unit 210 shown in FIG. 12 has a circular outer edge, the light-emitting unit 210 (exactly, the casing 211) is not limited to any particular shape.

Unlike headlamps, downlights require no ideal point source, and a single light-emitting point is sufficient. Downlights therefore have fewer limitations on the shape, size, and placement of the light-emitting element 7 than headlamps.

(Structure of LD Light Source Unit 220)

As shown in FIG. 14, the LD light source unit 220 includes a semiconductor laser 3, an aspherical lens 4, and an optical fiber 5.

One end of the optical fiber 5, i.e., the input end 5b, is connected to the LD light source unit 220. The laser light emitted from the semiconductor laser 3 enters the input end 5b of the optical fiber 5 through the aspherical lens 4.

The LD light source unit 220 shown in FIG. 14 accommodates only one pair of the semiconductor laser 3 and the aspherical lens 4. However, if a plurality of light-emitting units 210 are installed, a bundle of optical fibers 5 extending from the light-emitting units 210 may be routed into the single LD light source unit 220. In this case, the single LD light source unit 220 accommodates a plurality of pairs of the semiconductor laser 3 and the aspherical lens 4 and functions as a centralized power supply box.

(Modification of Method for Installing Laser Downlight 200)

FIG. 15 is a sectional view showing a modification of the method for installing the laser downlight 200 shown in FIG. 14. In the modification of the method for installing the laser downlight 200, as shown in FIG. 15, a small hole 402 through which the optical fiber 5 passes may be formed in the top plate 400, and the laser downlight unit (light-emitting unit 210), which is thin and lightweight, may be attached to the top plate 400. This provides the advantages of fewer limitations on the installation of the laser downlight 200 and significantly reduced construction costs.

In this structure, the entire surface of the heat-conducting member 13 on which the laser light is incident is in contact with the bottom of the casing 211. If the casing 211 is formed of a material with high thermal conductivity, the casing 211 functions as a heat-dissipating element that dissipates the heat conducted to the heat-conducting member 13.

(Comparison of Laser Downlight 200 with Conventional LED Downlight 300)

As shown in FIG. 12, the conventional LED downlight 300 includes a plurality of light-transmissive plates 301 and outputs illumination light through each light-transmissive plate 301. That is, the LED downlight 300 has a plurality of light-emitting points. The reason for the plurality of light-emitting points in the LED downlight 300 is that a plurality of light-emitting points are required to provide illumination light with sufficient luminous flux because each light-emitting point emits light with relatively low luminous flux.

In contrast, the laser downlight 200 may have a single light-emitting point because it is a high-luminous-flux illumination system. This provides the advantage that the illumination light forms a clear shadow. In addition, a high-color-rendering phosphor (for example, a combination of several oxynitride phosphors) may be used as the phosphor for the light-emitting element 7 to improve the color rendering of the illumination light.

Thus, the laser downlight 200 provides high color rendering approaching that of incandescent downlights. For example, the combination of the semiconductor laser 3 with a high-color-rendering phosphor provides high-color-rendering light with a general color rendering index Ra of 90 or more and a special color rendering index R9 of 95 or more, which is difficult to provide with LED downlights and fluorescent downlights.

FIG. 16 is a sectional view of a ceiling in which conventional LED downlights 300 are installed. As shown in FIG. 16, the LED downlights 300 include a casing 302 accommodating an LED chip, a power supply, and a cooling unit and embedded in a top plate 400. The casing 302 is relatively large and is disposed in a recess formed along the shape of the casing 302 in a heat-insulating material 401. A power supply line 303 extends from the casing 302 to an outlet (not shown).

This structure has the following problems. One problem is that the ceiling temperature rises during the use of the LED downlights 300 because the light sources (LED chips) and the power supplies, which are heat sources, are disposed between the top plate 400 and the heat-insulating material 401. This decreases the cooling efficiency of the room.

Another problem is that the LED downlights 300 require a power supply and a cooling unit for each light source. This increases the total cost.

A further problem is that it is often difficult to install the LED downlights 300 in the gap between the top plate 400 and the heat-insulating material 401 because the casings 302 are relatively large.

In contrast, the light-emitting unit 210 of the laser downlight 200 includes no large heat source that decreases the cooling efficiency of the room. As a result, an increase in the cooling cost of the room can be avoided.

In addition, the laser downlight 200 is compact and thin because it requires no power supply or cooling unit for each light-emitting unit 210. As a result, the laser downlight 200 has fewer limitations on installation space and can therefore be more easily installed in an existing house.

Because the laser downlight 200 is compact and thin, as described above, the light-emitting unit 210 can be installed in the ceiling 400. As a result, the laser downlight 200 has fewer limitations on installation than the LED downlight 300, and the construction costs can also be significantly reduced.

FIG. 17 is a table comparing the specifications of the laser downlight 200 with the specifications of the conventional LED downlight 300. As shown in FIG. 17, in one example, the laser downlight 200 has a 94% smaller volume and a 86% smaller mass than the LED downlight 300.

Because the LD light source unit 220 can be installed at a site easily accessible to the user, a failed semiconductor laser 3 can be easily replaced. In addition, because the optical fibers 5 extending from the plurality of light-emitting units 210 are routed into the single LD light source unit 220, the plurality of light-emitting units 210 can be managed together. A plurality of semiconductor lasers 3 can therefore be easily replaced.

If a high-color-rendering phosphor is used for the LED downlight 300, it emits light with a luminous flux of about 500 lm at a power consumption of 10 W. To achieve light with the same brightness, the laser downlight 200 requires an optical power of 3.3 W. This optical power is equivalent to a power consumption of 10 W for an LD efficiency of 35%. Because the LED downlight 300 also has a power consumption of 10 W, they have no significant difference in power consumption. Thus, the laser downlight 200 provides the various advantages described above with the same power consumption as the LED downlight 300.

As described above, the laser downlight 200 includes the LD light source unit 220 including at least one semiconductor laser 3 that emits laser light, at least one light-emitting unit 210 including the light-emitting element 7 and having the recess 212 as a reflective mirror, and the optical fiber 5 through which the laser light is guided to the light-emitting unit 210.

(Modification of Structure of Laser Downlight 200)

FIG. 18 is a sectional view showing a modification of the laser downlight 200 shown in FIG. 14. FIG. 18 illustrates a laser downlight 230 including no gap layer 15 according to the present invention.

As shown in FIG. 18, the laser downlight 230 includes a light-emitting unit 240 including a casing 211, an optical fiber 5, a light-emitting element 17, a heat-conducting member 13, and a light-transmissive plate 213. Although not shown in FIG. 18, a high-thermal-conductivity filler is dispersed in the light-emitting element 17. As in the third embodiment, the heat generated by the light-emitting element 17 is conducted to the heat-conducting member 13 to promote heat dissipation from the light-emitting element 17.

The casing 211 has a recess 212, and the light-emitting element 17 is disposed on the bottom of the recess 212. A thin metal film is formed on the surface of the recess 212 so that the recess 212 functions as a reflective mirror.

The casing 211 also has a passage 214 through which the optical fiber 5 passes. The optical fiber 5 extends through the passage 214 to the heat-conducting member 13. The laser light output from the output end 5a of the optical fiber 5 passes through the heat-conducting member 13 to reach the light-emitting element 17.

The light-transmissive plate 213 is a transparent or translucent plate covering the opening of the recess 212. The light-transmissive plate 213 has a similar function to the transparent plate 9, and the fluorescence emitted from the light-emitting element 17 is output through the light-transmissive plate 213 as illumination light. The light-transmissive plate 213 may be detachable from the casing 211 or may be omitted.

Figure 19:
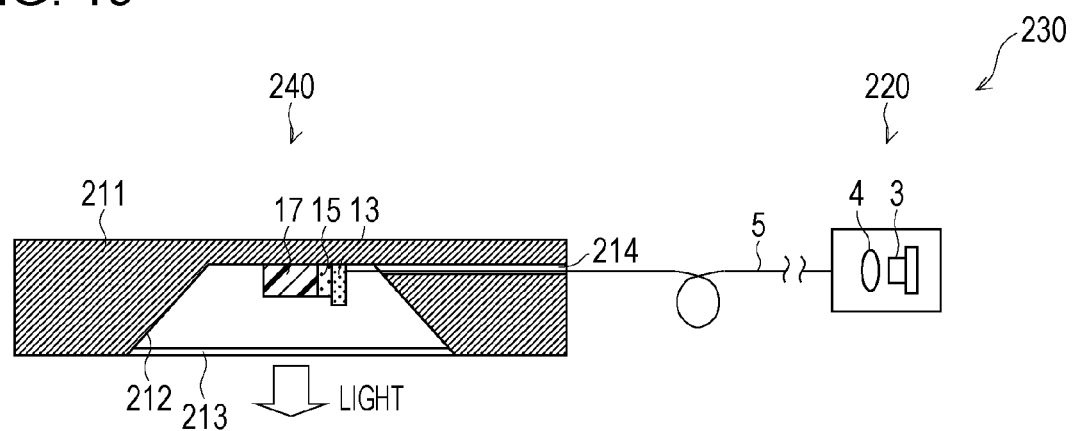
FIG. 19 is an illustration showing a structure in which a light-emitting element and a heat-conducting member are bonded with a gap layer in the light-emitting unit shown in FIG. 18.

FIG. 19 is an illustration showing a structure in which the light-emitting element 17 and the heat-conducting member 13 are bonded with the gap layer 15 in the light-emitting unit 240 shown in FIG. 18. The light-emitting element 17 of the light-emitting unit 240 is formed by sintering a ceramic material and a phosphor with a binder. The light-emitting element 17 therefore has high thermal conductivity, which allows heat to be efficiently conducted from the light-emitting element 17 to the heat-conducting member 13 and thus to be effectively dissipated from the light-emitting element 17. This prevents thermal degradation and decreased luminous efficiency of the light-emitting element 17 in the light-emitting unit 240.

In the light-emitting unit 240, the light-emitting element 17 and the heat-conducting member 13 are bonded with the gap layer 15, which contains an inorganic amorphous material. The gap layer 15 can conduct the heat generated by the light-emitting element 17 to the heat-conducting member 13 without limiting the rate thereof.

Thus, the heat generated by the light-emitting element 17 can be more efficiently conducted to the heat-conducting member 13. This further improves the effect of heat dissipation from the light-emitting element 17 of the light-emitting unit 240.

(Modification of Method for Installing Laser Downlight 230)

Figure 20:
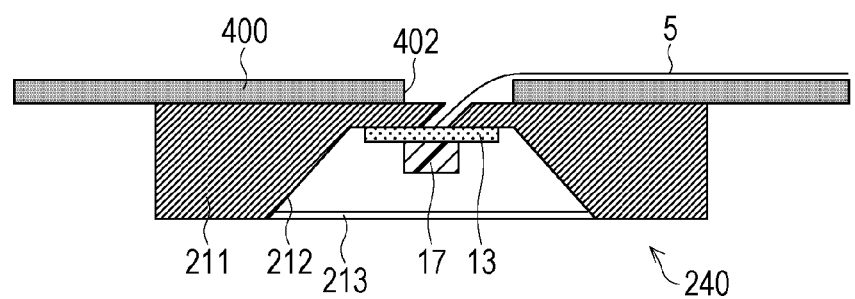
FIG. 20 is a sectional view showing a modification of the method for installing the laser downlight shown in FIG. 18.

FIG. 20 is a sectional view showing a modification of the method for installing the laser downlight 230 shown in FIG. 18. In the modification of the method for installing the laser downlight 230, as shown in FIG. 20, a small hole 402 through which the optical fiber 5 passes may be formed in the top plate 400, and the laser downlight unit (light-emitting unit 240), which is thin and lightweight, may be attached to the top plate 400. This provides the advantages of fewer limitations on the installation of the laser downlight 230 and significantly reduced construction costs.

In this structure, the entire surface of the heat-conducting member 13 on which the laser light is incident is in contact with the bottom of the casing 211. If the casing 211 is formed of a material with high thermal conductivity, the casing 211 functions as a cooling element for the heat-conducting member 13.

(Other Modifications)

The present invention is not limited to the above embodiments, but various modifications are possible within the scope of the claims. Various embodiments that combine technical means disclosed in different embodiments are also included in the technical scope of the present invention.

For example, the excitation light source may be a high-power LED. In this case, an LED that emits light with a wavelength of 450 nm (blue) may be used in combination with a yellow phosphor or with green and red phosphors to provide a white light-emitting apparatus.

If the excitation light source is a high-power LED, the gap layer 15 and the light-emitting element 7 or 17 preferably have a refractive index difference of 0.3 or more.

In this case, if the light-emitting element 7 or 17 is irradiated with excitation light emitted from the LED in the direction from the light-emitting element 7 or 17 toward the heat-conducting member 13, the interface between the light-emitting element 7 or 17 and the gap layer 15 has high reflectance for excitation light passing through the light-emitting element 7 or 17 to reach the interface. The interface between the light-emitting element 7 or 17 and the gap layer 15 can therefore reflect the excitation light that reaches the interface without being used for excitation of the phosphor contained in the light-emitting element 7 or 17 back to the interior of the light-emitting element 7 or 17. This increases the proportion of the light that excites the phosphor contained in the light-emitting element 7 or 17.

Thus, the availability of the excitation light can be increased for the same power of the excitation light so that the light-emitting element 7 or 17 can emit more light.

The excitation light source may also be a solid-state laser, rather than a semiconductor laser, although semiconductor lasers are preferred in that the size of the excitation light source can be reduced.

Overview of Embodiments

As described above, to solve the foregoing problems, a light-emitting apparatus according to the present invention includes an excitation light source that emits excitation light, a light emitter that emits light in response to the excitation light emitted from the excitation light source, a heat-conducting member that has a light-emitter facing surface facing the light emitter and that receives heat generated by the light emitter through the light-emitter facing surface, and a gap layer that is disposed between the light emitter and the light-emitter facing surface and that conducts the heat generated by the light emitter to the light-emitter facing surface. The gap layer contains at least an inorganic amorphous material.

In the above structure, the gap layer conducts the heat generated by the light emitter when the light emitter emits light in response to the excitation light through the light-emitter facing surface to the heat-conducting member to dissipate the heat generated by the light emitter.

The gap layer fills the gap between the light emitter and the light-emitter facing surface, thereby increasing the effective thermal contact area between the light emitter and the heat-conducting member. The gap layer can therefore efficiently conduct the heat generated by the light emitter to the heat-conducting member.

Because the inorganic amorphous material has high thermal conductivity, the thermal resistance of the gap layer is about one tenth that of, for example, a gap layer formed of an organic material such as resin. The gap layer, containing the inorganic amorphous material, can therefore conduct the heat generated by the light emitter to the heat-conducting member without limiting the rate thereof.

Thus, the above structure can efficiently dissipate the heat generated by the light emitter and can also prevent a decrease in the luminous efficiency of the light emitter, thereby reducing degradation of the light emitter.

Because the inorganic amorphous material is resistant to higher temperatures than organic materials, the inorganic amorphous material can maintain the function of conducting the heat generated by the light emitter to the heat-conducting member when the light emitter is at higher temperatures. The above structure can therefore improve the reliability of the light-emitting apparatus in high-temperature environments.

The use of the inorganic amorphous material offers a wider range of material options to form a gap layer having sufficient light transmissivity in the visible wavelength region than, for example, inorganic crystalline materials and also causes little diffusion of the excitation light or the light emitted from the light emitter at crystal grain boundaries. The above structure therefore allows an optimum material to be selected to form a gap layer having characteristics suitable for the application and high light availability.

Thus, the present invention can provide a light-emitting apparatus that can efficiently dissipate heat generated by a light emitter.

In the light-emitting apparatus according to the present invention, the gap layer preferably further contains an organic binder.

Because the gap layer further contains an organic binder in the above structure, fine irregularities in the surface of the light emitter and the light-emitter facing surface can be filled with the inorganic amorphous material or the organic binder.

In the light-emitting apparatus according to the present invention, the volume ratio of the inorganic amorphous material to the organic binder is preferably 60:40 to 99.99:0.01.

Because the volume ratio of the inorganic amorphous material to the organic binder is 60:40 to 99.99:0.01 in the above structure, a gap layer having high thermal conductivity can be formed.

Such a gap layer can more efficiently conduct the heat generated by the light emitter to the heat-conducting member.

In the light-emitting apparatus according to the present invention, the gap layer preferably has a thermal expansion coefficient between the thermal expansion coefficient of the light emitter and the thermal expansion coefficient of the heat-conducting member.

In the above structure, the difference in thermal expansion coefficient between the gap layer and the light emitter and the difference in thermal expansion coefficient between the gap layer and the heat-conducting member are both smaller than the difference in thermal expansion coefficient between the light emitter and the heat-conducting member.

Therefore, if the gap layer, the light emitter, and the heat-conducting member expand due to the heat generated by the light emitter depending on their respective thermal expansion coefficients, there occur smaller differences in the amount of thermal expansion at the interface between the gap layer and the light emitter and at the interface between the gap layer and the heat-conducting member.

As a result, the mechanical stress at each interface due to the difference in the amount of thermal expansion can be reduced, thus improving the mounting reliability of the light-emitting apparatus.

In the light-emitting apparatus according to the present invention, at least an entire surface of the light emitter facing the gap layer is preferably in contact with the gap layer.

In the above structure, the contact area at the interface between the light emitter and the gap layer can be maximized.

Thus, the gap layer can efficiently conduct the heat generated by the light emitter to the heat-conducting member.

In the light-emitting apparatus according to the present invention, the excitation light source is preferably a laser light source.

Because the excitation light source is a laser light source in the above structure, the excitation efficiency of the light emitter can be improved.

In the light-emitting apparatus according to the present invention, the gap layer preferably has a refractive index between the refractive index of the light emitter and the refractive index of the heat-conducting member.

In the above structure, the difference in refractive index between the gap layer and the light emitter and the difference in refractive index between the gap layer and the heat-conducting member are both smaller than the difference in refractive index between the light emitter and the heat-conducting member.

As a result, the proportion of excitation light unavailable for excitation of the light emitter can be reduced, thus improving the availability of the excitation light.

In the light-emitting apparatus according to the present invention, the excitation light source is preferably a light-emitting diode, and the gap layer and the light emitter preferably have a refractive index difference of 0.3 or more.

In the above structure, if the light emitter is irradiated with excitation light emitted from the light-emitting diode in the direction from the light emitter toward the heat-conducting member, the interface between the light emitter and the gap layer has high reflectance for excitation light passing through the light emitter to reach the interface. The interface between the light emitter and the gap layer can therefore reflect the excitation light that reaches the interface without being used for excitation of the light emitter back to the interior of the light emitter. This increases the proportion of the light that excites the light emitter.

Thus, the availability of the excitation light can be increased for the same power of the excitation light so that the light emitter can emit more light.

The light-emitting apparatus according to the present invention preferably outputs as illumination light the light emitted from the light emitter or a mixture of the excitation light emitted from the excitation light source and the light emitted from the light emitter.

The light-emitting apparatus of the above structure outputs as illumination light the light emitted from the light emitter. For example, the color of the light (fluorescence) emitted from the light emitter can be adjusted so that the light-emitting apparatus outputs illumination light of the desired color.

Alternatively, the light-emitting apparatus of the above structure outputs as illumination light a mixture of the excitation light emitted from the excitation light source and the light emitted from the light emitter. For example, suitable combinations of various types of light (fluorescence) emitted from light emitters and excitation light can be selected so that the light-emitting apparatus outputs illumination light of the desired color.

In the light-emitting apparatus according to the present invention, the light emitter preferably contains a nanoparticle phosphor.

Because the light emitter contains a nanoparticle phosphor in the above structure, the light emitter is light-transmissive in and around the visible wavelength region. This improves the efficiency of radiation from the phosphor outside the light emitter.

In the light-emitting apparatus according to the present invention, the light emitter is preferably a sintered light emitter formed by sintering a ceramic material and a phosphor that emits light in response to the excitation light emitted from the excitation light source with a binder.

In the above structure, the light emitter is a sintered light emitter formed by sintering a ceramic material and a phosphor that emits light in response to the excitation light emitted from the excitation light source with a binder.

The thermal conductivity of the ceramic material improves the thermal conductivity and therefore decreases the thermal resistance of the light emitter, thus allowing heat to be efficiently dissipated from the light emitter. The gap layer can therefore more efficiently conduct the heat generated by the light emitter through the light-emitter facing surface to the heat-conducting member. Such efficient heat dissipation from the light emitter can also prevent problems such as a shortened life of the light emitter due to thermal degradation and damage.

Thus, the above structure can more efficiently dissipate the heat generated by the light emitter.

The use of the sintered light emitter also provides the following advantage. Specifically, the sintered light emitter contains grain boundaries because it is formed by sintering a ceramic material and a phosphor with a binder. If the excitation light is laser light, which contains a coherent component and is therefore likely to damage the human eyes, the laser light is scattered by the grain boundaries. This magnifies the light-emitting point, thus improving the safety of the sintered light emitter and the light-emitting apparatus including the sintered light emitter.

In the light-emitting apparatus according to the present invention, the ceramic material preferably has high thermal conductivity.

Because the ceramic material has high thermal conductivity in the above structure, the effect of heat dissipation from the sintered light emitter can be further improved.

In the light-emitting apparatus according to the present invention, the ceramic material preferably contains alumina or aluminum nitride.

Because the ceramic material contains alumina or aluminum nitride in the above structure, the sintered light emitter is transparent and has high thermal conductivity.

In the light-emitting apparatus according to the present invention, the sintered light emitter is preferably formed by injection molding and sintering of a mixture of the ceramic material, the phosphor, and the binder.

A conventional technique in which a light emitter is fabricated by a melting process has a problem in that the light emitter exhibits decreased luminous efficiency because the phosphor is not uniformly dispersed therein.

In the above structure, the sintered light emitter is formed by injection molding and sintering of a mixture of the ceramic material, the phosphor, and the binder. This allows the phosphor to be uniformly dispersed and thus eliminates the problem of the conventional technique, i.e., a decrease in the luminous efficiency of the light emitter.

In the light-emitting apparatus according to the present invention, the ceramic material is preferably light-transmissive.

Because the ceramic material contained in the sintered light emitter is light-transmissive in the above structure, the luminous efficiency of the phosphor, that is, the luminous efficiency of the light emitter, can be improved.

In the light-emitting apparatus according to the present invention, the sintered light emitter preferably contains as the phosphor at least one of an oxynitride phosphor and a nitride phosphor.

Oxynitride phosphors and nitride phosphors have superior heat resistance and are stable with high luminous efficiency.

Because the sintered light emitter contains at least one of an oxynitride phosphor and a nitride phosphor, which have high heat resistance, in the above structure, the reliability of the light-emitting apparatus in high-temperature environments can be further improved.

Oxynitride phosphors and nitride phosphors also exhibit a relatively small decrease in luminous efficiency due to a temperature rise. This allows the light-emitting apparatus to efficiently emit illumination light in high-temperature environments.

Illumination systems, vehicle headlamps, and projectors including the above light-emitting apparatus are also included in the technical scope of the present invention.

A method for manufacturing a light-emitting apparatus according to the present invention is a method for manufacturing the above light-emitting apparatus, including a gap-layer forming step of forming the gap layer. The gap-layer forming step includes applying the inorganic amorphous material to at least one of the light emitter and the light-emitter facing surface by screen printing.

Because the inorganic amorphous material is applied by screen printing in the above method, the thickness of the gap layer can be precisely controlled. This allows a thin gap layer with uniform thickness to be precisely formed.

Thus, the thermal resistance of the gap layer to be formed can be reduced, which allows the formation of a gap layer that efficiently conducts the heat generated by the light emitter to the heat-conducting member.

A method for manufacturing a light-emitting apparatus according to the present invention is a method for manufacturing the above light-emitting apparatus, including a mixing step of mixing the ceramic material, the phosphor that emits light in response to the excitation light emitted from the excitation light source, and the binder; a sintering step of sintering the mixture prepared in the mixing step to form the sintered light emitter; and a gap-layer forming step of forming the gap layer. The gap-layer forming step includes applying the inorganic amorphous material to at least one of the sintered light emitter and the light-emitter facing surface by screen printing.

Because the inorganic amorphous material is applied by screen printing in the above method, the thickness of the gap layer can be precisely controlled. This allows a thin gap layer with uniform thickness to be precisely formed.

Thus, the thermal resistance of the gap layer to be formed can be reduced, which allows the formation of a gap layer that efficiently conducts the heat generated by the sintered light emitter to the heat-conducting member.

A conventional technique in which a light emitter is fabricated by a melting process has a problem in that the light emitter exhibits decreased luminous efficiency because the phosphor is not uniformly dispersed therein.

In the above method, the sintered light emitter is fabricated by the mixing and sintering steps. This allows the phosphor to be uniformly dispersed and thus eliminates the problem of the conventional technique, i.e., a decrease in the luminous efficiency of the sintered light emitter.

[Supplements]

The present invention can be described as follows. Specifically, a light-emitting apparatus according to the present invention includes an excitation light source that emits excitation light; a light-emitting element that emits light in response to the excitation light emitted from the excitation light source; a heat-conducting member that has a light-emitting-element facing surface facing the light-emitting element and that receives heat generated by the light-emitting element through the light-emitting-element facing surface; and a gap layer that fills a gap between the light-emitting element and the light-emitting-element facing surface and that conducts the heat generated by the light-emitting element to the light-emitting-element facing surface. The gap layer is an inorganic amorphous layer containing a major proportion of an inorganic amorphous material.

Because the inorganic amorphous material has a higher thermal conductivity and is resistant to higher temperatures than organic materials such as resins, the gap layer, containing the inorganic amorphous material, can efficiently dissipate the heat generated by the light-emitting element and can also prevent a decrease in the luminous efficiency of the phosphor contained in the light-emitting element, thereby reducing degradation of the light-emitting element. This also improves the reliability of the light-emitting apparatus in high-temperature environments.

The use of the inorganic amorphous material offers a wider range of material options to form a gap layer having sufficient light transmissivity in the visible wavelength region than inorganic crystalline materials and also causes little diffusion of excitation light or fluorescence at crystal grain boundaries. This allows an optimum material to be selected to form a gap layer having characteristics suitable for the application and high light availability.

In the light-emitting apparatus according to the present invention, the gap layer preferably further contains an organic binder.

In the light-emitting apparatus according to the present invention, preferably, the excitation light source is a laser, and if the light-emitting apparatus outputs as illumination light the portion of the excitation light, emitted from the excitation light source, that is transmitted by the light-emitting element and the light emitted from the light-emitting element, the gap layer has a refractive index between the refractive index of the light-emitting element and the refractive index of the heat-conducting member.

In the light-emitting apparatus according to the present invention, preferably, the excitation light source is an LED, the light-emitting apparatus outputs as illumination light the portion of the excitation light, emitted from the excitation light source, that is reflected or scattered by the light-emitting element and the light emitted from the light-emitting element, and the gap layer and the light-emitting element have a refractive index difference of 0.3 or more.

In the light-emitting apparatus according to the present invention, the area of the interface between the light-emitting element and the gap layer on the gap layer side is preferably larger than or equal to the area of the interface between the light-emitting element and the gap layer on the light-emitting element side.

In the light-emitting apparatus according to the present invention, the light-emitting element preferably contains at least one of an oxynitride phosphor and a nitride phosphor.

A method for manufacturing a light-emitting apparatus according to the present invention is a method for manufacturing the light-emitting apparatus including the excitation light source that emits excitation light, the light-emitting element that emits light in response to the excitation light, the heat-conducting member that receives heat generated by the light-emitting element, and the gap layer that fills the gap between the light-emitting element and the light-emitting-element facing surface and that conducts the heat generated by the light-emitting element to the light-emitting-element facing surface without limiting the rate thereof. This method includes a step of applying an inorganic amorphous material by screen printing.

INDUSTRIAL APPLICABILITY

The present invention is applicable to high-intensity, long-life light-emitting apparatuses and illumination systems, and particularly to headlamps such as for vehicles.

REFERENCE SIGNS LIST 1 headlamp (vehicle headlamp)
2 semiconductor laser array (excitation light source)
3 semiconductor laser (excitation light source)
4 aspherical lens
5 optical fiber
6 ferrule
7 light-emitting element (light emitter)
7a laser-light irradiation surface
8 reflective mirror
9 transparent plate
10 housing
11 extension
12 lens
13 heat-conducting member
13a light-emitting-element facing surface (light-emitter facing surface)
14 cooling element
15 gap layer
16 phosphor particle (phosphor)
17 light-emitting element (light emitter, sintered light emitter)
18a heat-conducting wall (heat-conducting member)
30 headlamp (vehicle headlamp)
60 headlamp (vehicle headlamp)
200 laser downlight (illumination system)
230 laser downlight (illumination system)

The invention claimed is:

1. A light-emitting apparatus comprising:
an excitation light source that emits excitation light;
a light emitter that emits light in response to the excitation light emitted from the excitation light source;
a heat-conducting member that has a light-emitter facing surface facing the light emitter and that receives heat generated by the light emitter through the light-emitter facing surface; and
a gap layer that is disposed between the light emitter and the light-emitter facing surface and that conducts the heat generated by the light emitter to the light-emitter facing surface,
wherein the gap layer contains at least an inorganic amorphous material, and
the heat-conducting member is transparent and placed in the light emitting apparatus so that the excitation light passes through the heat-conducting member and the gap layer in this order so as to reach the light emitter.

2. The light-emitting apparatus according to claim 1, wherein the gap layer further contains an organic binder.

3. The light-emitting apparatus according to claim 2, wherein the volume ratio of the inorganic amorphous material to the organic binder is 60:40 to 99.99:0.01.

4. The light-emitting apparatus according to claim 1, wherein the gap layer has a thermal expansion coefficient between the thermal expansion coefficient of the light emitter and the thermal expansion coefficient of the heat-conducting member.

5. The light-emitting apparatus according to claim 1, wherein an entire surface of the light emitter facing the gap layer is in contact with the gap layer.

6. The light-emitting apparatus according to claim 1, wherein the excitation light source is a laser light source.

7. The light-emitting apparatus according to claim 6, wherein the gap layer has a refractive index between the refractive index of the light emitter and the refractive index of the heat-conducting member.

8. The light-emitting apparatus according to claim 1, wherein
the excitation light source is a light-emitting diode; and
the gap layer and the light emitter have a refractive index difference of 0.3 or more.

9. The light-emitting apparatus according to claim 1, wherein the light-emitting apparatus outputs as illumination light the light emitted from the light emitter or a mixture of the excitation light emitted from the excitation light source and the light emitted from the light emitter.

10. The light-emitting apparatus according to claim 1, wherein the light emitter contains a nanoparticle phosphor.

11. The light-emitting apparatus according to claim 1, wherein the light emitter is a sintered light emitter formed by sintering a ceramic material and a phosphor that emits light in response to the excitation light emitted from the excitation light source with a binder.

12. The light-emitting apparatus according to claim 11, wherein the ceramic material has high thermal conductivity.

13. The light-emitting apparatus according to claim 11, wherein the ceramic material contains alumina or aluminum nitride.

14. The light-emitting apparatus according to claim 11, wherein the sintered light emitter is formed by injection molding and sintering of a mixture of the ceramic material, the phosphor, and the binder.

15. The light-emitting apparatus according to claim 11, wherein the ceramic material is light-transmissive.

16. The light-emitting apparatus according to claim 11, wherein the sintered light emitter contains as the phosphor at least one of an oxynitride phosphor and a nitride phosphor.

17. An illumination system comprising the light-emitting apparatus according to Previously Presented claim 1.

18. A vehicle headlamp comprising the light-emitting apparatus according to claim 1.

19. A projector comprising the light-emitting apparatus according to claim 1.

20. A method for manufacturing the light-emitting apparatus according to claim 1, the method comprising:
a gap-layer forming step of forming the gap layer,
wherein the gap-layer forming step includes applying the inorganic amorphous material to at least one of the light emitter and the light-emitter facing surface by screen printing.

* * * * *